United States Patent
Nozaki et al.

(10) Patent No.: US 11,133,459 B2
(45) Date of Patent: Sep. 28, 2021

(54) MAGNETIC ELEMENT, MAGNETIC MEMORY DEVICE, AND MAGNETIC SENSOR

(71) Applicants: National Institute of Advanced Industrial Science and Technology, Chiyoda-ku (JP); TOHOKU UNIVERSITY, Sendai (JP); NATIONAL INSTITUTE FOR MATERIALS SCIENCE, Tsukuba (JP)

(72) Inventors: Takayuki Nozaki, Tsukuba (JP); Shinji Yuasa, Tsukuba (JP); Rachwal Anna Koziol, Tsukuba (JP); Masahito Tsujikawa, Sendai (JP); Masafumi Shirai, Sendai (JP); Kazuhiro Hono, Tsukuba (JP); Tadakatsu Ohkubo, Tsukuba (JP); Xiandong Xu, Tsukuba (JP)

(73) Assignees: National Institute of Advanced Industrial Science and Technology, Chiyoda-ku (JP); TOHOKU UNIVERSITY, Sendai (JP); NATIONAL INSTITUTE FOR MATERIALS SCIENCE, Tsukuba (JP)

(*) Notice: Subject to any disclaimer, the term of this patent is extended or adjusted under 35 U.S.C. 154(b) by 17 days.

(21) Appl. No.: 16/498,936

(22) PCT Filed: Feb. 15, 2018

(86) PCT No.: PCT/JP2018/005290
§ 371 (c)(1),
(2) Date: Sep. 27, 2019

(87) PCT Pub. No.: WO2018/179961
PCT Pub. Date: Oct. 4, 2018

(65) Prior Publication Data
US 2021/0036217 A1    Feb. 4, 2021

(30) Foreign Application Priority Data

Mar. 30, 2017   (JP) .............................. JP2017-067235

(51) Int. Cl.
| | | |
|---|---|---|
| *H01L 43/10* | (2006.01) | |
| *H01F 10/14* | (2006.01) | |
| *H01F 10/30* | (2006.01) | |
| *H01L 27/22* | (2006.01) | |
| *H01L 29/82* | (2006.01) | |

(52) U.S. Cl.
CPC ............. *H01L 43/10* (2013.01); *H01F 10/14* (2013.01); *H01F 10/30* (2013.01); *H01L 27/222* (2013.01); *H01L 29/82* (2013.01)

(58) Field of Classification Search
CPC ....... H01L 43/10; H01L 27/222; H01L 29/82; H01F 10/14; H01F 10/30
(Continued)

(56) References Cited

U.S. PATENT DOCUMENTS

| | | |
|---|---|---|
| 6,710,986 B1 | 3/2004 | Sato et al. |
| 2002/0006529 A1 | 1/2002 | Sakakima et al. |

(Continued)

FOREIGN PATENT DOCUMENTS

| | | |
|---|---|---|
| JP | 2000-150236 A | 5/2000 |
| JP | 2001-93119 A | 4/2001 |

(Continued)

OTHER PUBLICATIONS

International Search Report dated Apr. 24, 2018 in PCT/JP2018/005290 filed Feb. 15, 2018.

*Primary Examiner* — Tu-Tu V Ho
(74) *Attorney, Agent, or Firm* — Oblon, McClelland, Maier & Neustadt, L.L.P.

(57) ABSTRACT

According to one embodiment, a magnetic element includes a first layer and a second layer. The first layer includes a first element and a second element. The first element includes at (Continued)

least one selected from the group consisting of Fe, Co, and Ni. The second element includes at least one selected from the group consisting of Ir and Os. The second layer is nonmagnetic.

13 Claims, 13 Drawing Sheets

(58) Field of Classification Search
USPC .......................................................... 257/421
See application file for complete search history.

(56) References Cited

U.S. PATENT DOCUMENTS

| | | | |
|---|---|---|---|
| 2008/0026253 A1* | 1/2008 | Yuasa | H01L 43/08 428/811 |
| 2011/0049659 A1 | 3/2011 | Suzuki et al. | |
| 2012/0068139 A1 | 3/2012 | Daibou et al. | |
| 2012/0069642 A1* | 3/2012 | Ueda | H01L 43/10 365/158 |
| 2013/0001714 A1 | 1/2013 | Nishiyama et al. | |
| 2013/0249026 A1 | 9/2013 | Kitagawa et al. | |
| 2014/0063648 A1 | 3/2014 | Shiroishi et al. | |

FOREIGN PATENT DOCUMENTS

| | | |
|---|---|---|
| JP | 2012-64776 A | 3/2012 |
| JP | 2013-16560 A | 1/2013 |
| JP | 2013-197345 A | 9/2013 |
| JP | 2014-49145 A | 3/2014 |
| WO | WO 2009/133650 A1 | 11/2009 |

* cited by examiner

MAGNETIC ELEMENT, MAGNETIC MEMORY DEVICE, AND MAGNETIC SENSOR

TECHNICAL FIELD

Embodiments of the invention relate to a magnetic element, a magnetic memory device, and a magnetic sensor.

BACKGROUND ART

Stable operations are obtained by appropriately controlling the magnetic anisotropy of a magnetic element used in a magnetic memory device, a magnetic sensor, etc.

PRIOR ART DOCUMENT

Patent Document

[Patent Document 1] International Publication 2009/133650

SUMMARY OF INVENTION

Problem to be Solved by the Invention

Embodiments of the invention provide a magnetic element, a magnetic memory device, and a magnetic sensor in which the operational stability can be improved.

Means for Solving the Problem

According to an embodiment of the invention, a magnetic element includes a first layer and a second layer. The first layer includes a first element including at least one selected from the group consisting of Fe, Co, and Ni, and a second element including at least one selected from the group consisting of Ir and Os. The second layer is nonmagnetic.

Effects of the Invention

According to an embodiment of the invention, a magnetic element, a magnetic memory device, and a magnetic sensor can be provided in which the operational stability can be improved.

EMBODIMENTS OF INVENTION

Figure 1:
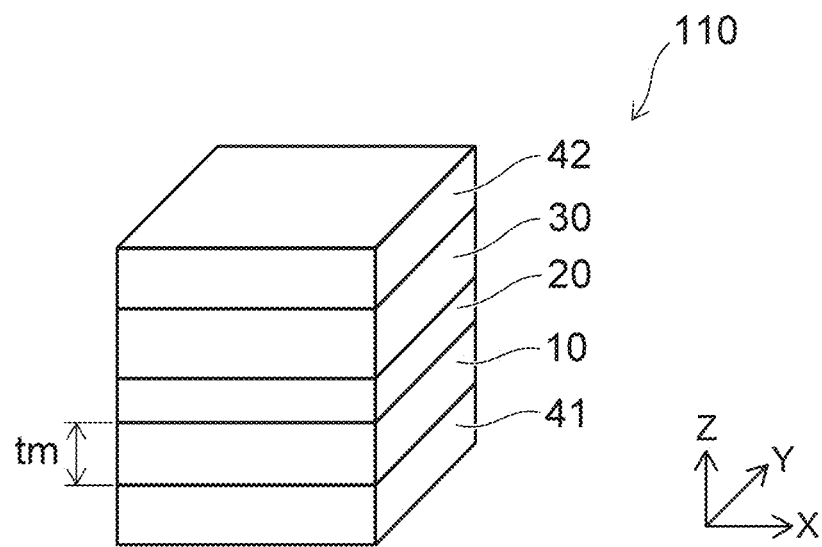
FIG. 1 is a schematic perspective view illustrating a magnetic element according to a first embodiment.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic perspective view illustrating a magnetic element according to a first embodiment.

As shown in FIG. 1, the magnetic element 110 according to the embodiment includes a first layer 10 and a second layer 20. In the example, a third layer 30, a first conductive layer 41, and a second conductive layer 42 are further provided.

The first layer 10 includes a first element and a second element. The first element includes at least one selected from the group consisting of Fe, Co, and Ni. The second element includes at least one selected from the group consisting of Ir and Os. The first layer 10 includes, for example, FeIr. The first layer 10 is, for example, an FeIr alloy. The concentration of the second element in the first layer 10 is not less than 3 atomic percent and not more than 25 atomic percent. The first layer 10 is, for example, a ferromagnetic layer.

The second layer 20 includes, for example, at least one of an oxide of a third element, a nitride of the third element, or a fluoride of the third element. The third element includes, for example, at least one selected from the group consisting of Mg, Si, Al, Ti, Zr, Hf, Ta, Zn, Sr, and Ba. The second layer 20 includes, for example, magnesium oxide (MgO). The second layer 20 is, for example, nonmagnetic. For example, the second layer 20 contacts the first layer 10.

For example, the first layer 10 is provided between the first conductive layer 41 and the second conductive layer 42. The second layer 20 is provided between the first layer 10 and the second conductive layer 42. The third layer 30 is provided between the second layer 20 and the second conductive layer 42. The second layer 20 is positioned between the first layer 10 and the third layer 30. The third layer 30 is, for example, ferromagnetic. For example, the third layer 30 is made of a ferromagnetic body. The third layer 30 includes, for example, at least one selected from the group consisting of Fe, Co, Ni, and Mn. The first conductive layer 41 is electrically connected to the first layer 10. The second conductive layer 42 is electrically connected to the third layer 30. For example, a voltage (e.g., a voltage pulse) is supplied via these conductive layers to the stacked body including the first layer 10, the second layer 20, and the third layer 30. The electrical resistance of the stacked body changes before and after the application of the voltage pulse.

The third layer 30 is, for example, a ferromagnetic layer. For example, the third layer 30 functions as a reference layer. For example, the orientation of the magnetization of the third layer 30 is substantially not changed by the application of the voltage pulse. For example, at least a portion of the first layer 10 functions as a memory layer. For example, the orientation of the magnetization of at least a portion of the first layer 10 is changed by the application of the voltage pulse. For example, the orientation of the magnetization reverses. For example, the change of the electrical resistance of the stacked body before and after the application of the voltage pulse corresponds to the change of the relative relationship between the orientation of the magnetization of the third layer 30 and the orientation of the magnetization of at least a portion of the first layer 10.

A first direction from the first layer 10 toward the second layer 20 is taken as a Z-axis direction. One direction perpendicular to the Z-axis direction is taken as an X-axis direction. A direction perpendicular to the Z-axis direction and the X-axis direction is taken as a Y-axis direction. The layers such as the first layer 10, the second layer 20, etc., spread substantially parallel to the X-Y plane. In the magnetic element 110, the Z-axis direction corresponds to the stacking direction.

The thickness of each layer is the length along the Z-axis direction. For example, a thickness tm of the first layer 10 is the length of the first layer 10 along the Z-axis direction. In the embodiment, the thickness tm is, for example, not less than 0.26 nanometers (nm) and not more than 5 nm. 0.26 nm substantially corresponds to a thickness of 2 atomic layers. When the thickness of the first layer 10 is 5 nm or less, good controllability is obtained when using an external signal such as a voltage, a current, etc., to rewrite the orientation of the magnetization. When the thickness of the first layer 10 is 2 nm or less, for example, the power consumption can be small when using the external signal to rewrite.

As described below, it was found that a high interface magnetic anisotropy is obtained for the first layer 10 including the first element and the second element. According to the embodiment, for example, a stable magnetic anisotropy is obtained. According to the embodiment, a magnetic element, a magnetic memory device, and a magnetic sensor can be provided in which the operational stability can be improved.

Experimental results that relate to the magnetic element will now be described.

Figures 2A, 2B:
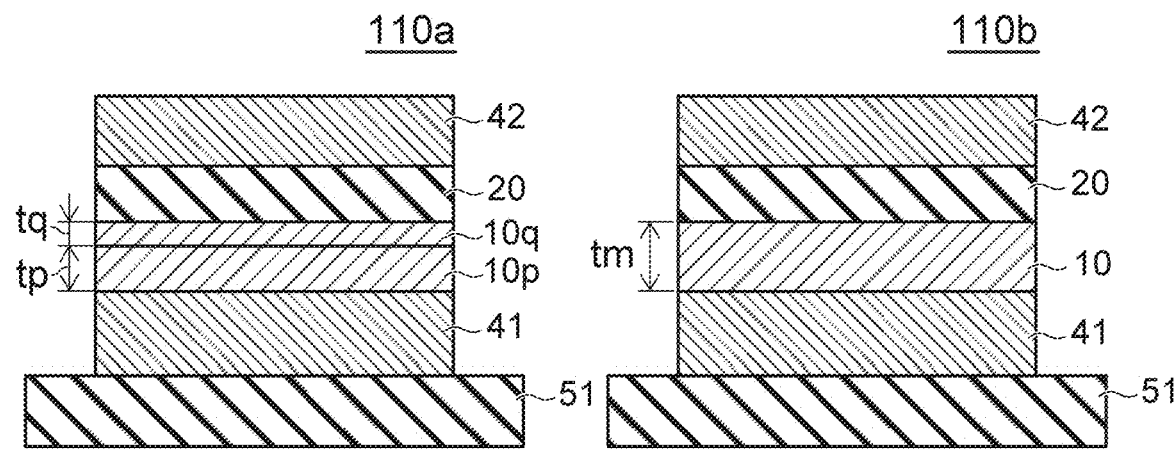
FIG. 2A and FIG. 2B are schematic cross-sectional views showing an experiment sample of the magnetic element.

FIG. 2A and FIG. 2B are schematic cross-sectional views showing an experiment sample of the magnetic element.

FIG. 2A illustrates the state of a sample 110a after forming the multiple films of the sample and before performing heat treatment (annealing). FIG. 2B illustrates the state of a sample 110b after the annealing after the film formation. The third layer 30 is not provided in the experiment sample.

As shown in FIG. 2A, a Cr film that is used to form the first conductive layer 41 is provided on a substrate 51. The substrate 51 is MgO having the (001) orientation. The thickness of the Cr film is 30 nm. An Fe film 10p is provided on the first conductive layer 41. In the experiment, a thickness tp of the Fe film 10p is modified in a range not less than 0.5 nm and 1.4 nm. An Ir film 10q is provided on the Fe film 10p. In the experiment, a thickness tq of the Ir film 10q is modified in the range of 0 nm to 0.15 nm. A MgO film that is used to form a second layer 20 is provided on the Ir film 10q. The thickness of the second layer 20 is about 2.3 nm. An ITO film (Indium Tin Oxide) that is used to form the second conductive layer 42 is provided on the MgO film. These films are formed by molecular beam epitaxy and sputtering. The formation of the Ir film 10q and the MgO film is performed at room temperature (about 25° C.). After forming these stacked films, heat treatment is performed for 20 minutes at 350° C.

In the sample 110b after the heat treatment as shown in FIG. 2B, a mixing region of FeIr is formed from the Fe film 10p and the Ir film 10q. For example, this is because the Ir inside the Ir film 10q diffuses into the Fe film 10p. This mixing region (alloy) corresponds to the first layer 10. Fe is replaced with Ir in at least a portion of the first layer 10. The body-centered cubic (bcc) structure is maintained in the first layer 10. The thickness tm of the mixing region (the first layer 10) of FeIr substantially corresponds to the sum of the thickness tp and the thickness tq.

Thus, multiple samples are made in which the thickness tq of the Ir film 10q is modified. The Ir concentration in the region (the first layer 10) including Fe and Ir is mutually-different between the multiple samples. In the experiment, a sample of a reference example in which the Ir film 10q is not provided also is made. The sample of the reference example corresponds to a sample in which the Ir concentration is 0.

An external magnetic field along the Z-axis direction (the stacking direction) is applied to these samples; the intensity of the external magnetic field is changed; and the Kerr rotation angle is measured.

Figure 3A:
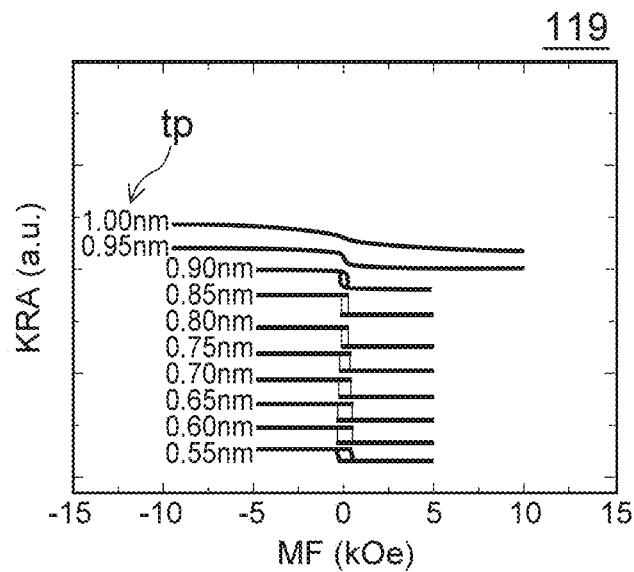
FIG. 3A to FIG. 3C are graphs showing experimental results.
Figure 3B:
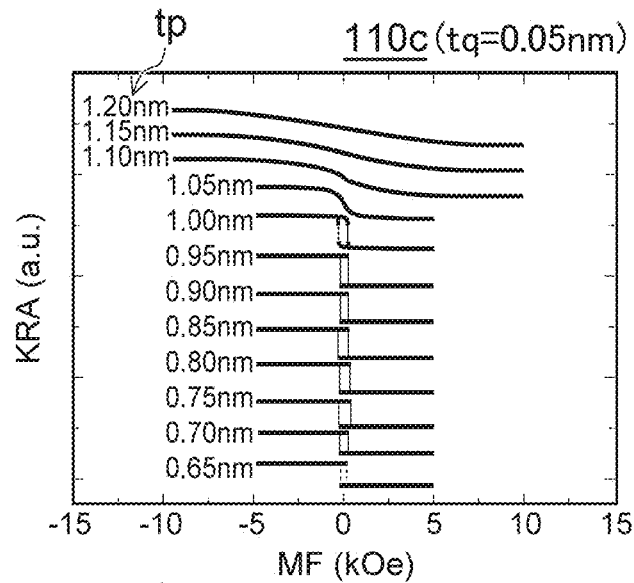
Figure 3C:
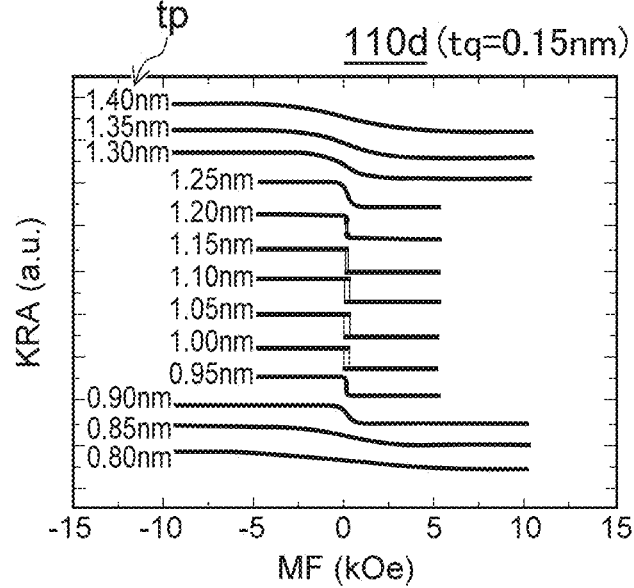

FIG. 3A to FIG. 3C are graphs showing experimental results.

FIG. 3A corresponds to a sample 119 of a reference example in which the Ir film 10q is not provided. The results of samples in which the thickness tp of the Fe film 10p is not less than 0.55 nm and not more than 1.00 nm are shown in FIG. 3A. FIG. 3B corresponds to a sample 110c in which the thickness tq of the Ir film 10q is 0.05 nm. The results of samples in which the thickness tp of the Fe film 10p is not less than 0.65 nm and not more than 1.20 nm are shown in FIG. 3B. FIG. 3C corresponds to a sample 110d in which the thickness tq of the Ir film 10q is 0.15 nm. The results of samples in which the thickness tp of the Fe film 10p is not less than 0.80 nm and not more than 1.40 nm are shown in FIG. 3C. In these figures, the horizontal axis is an intensity MF (kOe) of the external magnetic field. 1 Oe corresponds to $(1/4\pi) \times 10^3$ A/m. The vertical axis is a Kerr rotation angle KRA (arbitrary units).

As shown in FIG. 3A to FIG. 3C, magnetic hysteresis is observed in each of the samples in designated ranges of the thickness tp of the Fe film 10p. The magnetic hysteresis being observed corresponds to the easy magnetization axis in the first layer 10 (the region including Fe and Ir) having a component in the Z-axis direction (the surface normal direction).

In the sample 119, magnetic hysteresis is not observed when the thickness tp of the Fe film 10p is 0.95 nm or more. In the sample 110c, magnetic hysteresis is not observed when the thickness tp of the Fe film 10p is 1.1 nm or more. In the sample 110d, magnetic hysteresis is not observed when the thickness tp of the Fe film 10p is 1.30 nm or more. Thus, magnetic hysteresis is not observed when the thickness tp of the Fe film 10p becomes thick. In other words, the characteristics of an in-plane magnetization film are obtained. It is considered that this phenomenon is due to interface magnetic anisotropy occurring at the interface between the Fe film and the MgO film or the interface between the FeIr film and the MgO film.

For the sample 119, when the thickness tp of the Fe film 10p is 0.90 nm or less, magnetic hysteresis is observed; and a stable perpendicular magnetization anisotropy is obtained. For the sample 110c, when the thickness tp of the Fe film 10p is 1.0 nm or less, magnetic hysteresis is observed; and a stable perpendicular magnetization anisotropy is obtained. For the sample 110d, when the thickness tp of the Fe film 10p is 1.20 nm or less, magnetic hysteresis is observed; and a stable perpendicular magnetization anisotropy is obtained. Thus, the thicknesses (the thicknesses tp) of the upper limit for which magnetic hysteresis is observed (i.e., the stable perpendicular magnetization is obtained) are different from each other. It is considered that the perpendicular magnetic anisotropy of the sample 110c is higher than the perpendicular magnetic anisotropy of the sample 119. It is considered that the perpendicular magnetic anisotropy of the sample 110d is higher than the perpendicular magnetic anisotropy of the sample 110c.

For example, it is considered that an effective perpendicular magnetic anisotropy energy $K_{eff}$ is represented by the following formula.

$$K_{eff} = (K_v - \mu_0 M_s^2/2) + K_{i,0}/t$$

In the formula recited above, $K_v$ is the volume magnetic anisotropy energy. $\mu_0$ is the permeability of a vacuum. Ms is the saturation magnetization. $K_{i,0}$ is the interface magnetic anisotropy. t is the thickness of the magnetic layer. The interface magnetic anisotropy $K_{i,0}$ corresponds to the real interface magnetic anisotropy energy obtained in the case where a thickness of the magnetic layer of zero is assumed. When the interface magnetic anisotropy $K_{i,0}$ is high, a perpendicular magnetic anisotropy is stably obtained easily.

A graph of the relationship between the thickness t and the parameter "$K_{eff}$ t" is determined from the characteristics of the magnetic hysteresis curves illustrated in FIG. 3A to FIG. 3C. In this graph, the interface magnetic anisotropy $K_{i,0}$ can be determined from the intercept when the thickness t is zero.

In the samples recited above, the thickness t corresponds to the thickness tm of the first layer 10 (the region including Fe and Ir) after the heat treatment. As described above, for each sample, the thickness tm corresponds to the sum of the thickness tp of the Fe film 10p and the thickness tq of the Ir film 10q.

Figure 4A:
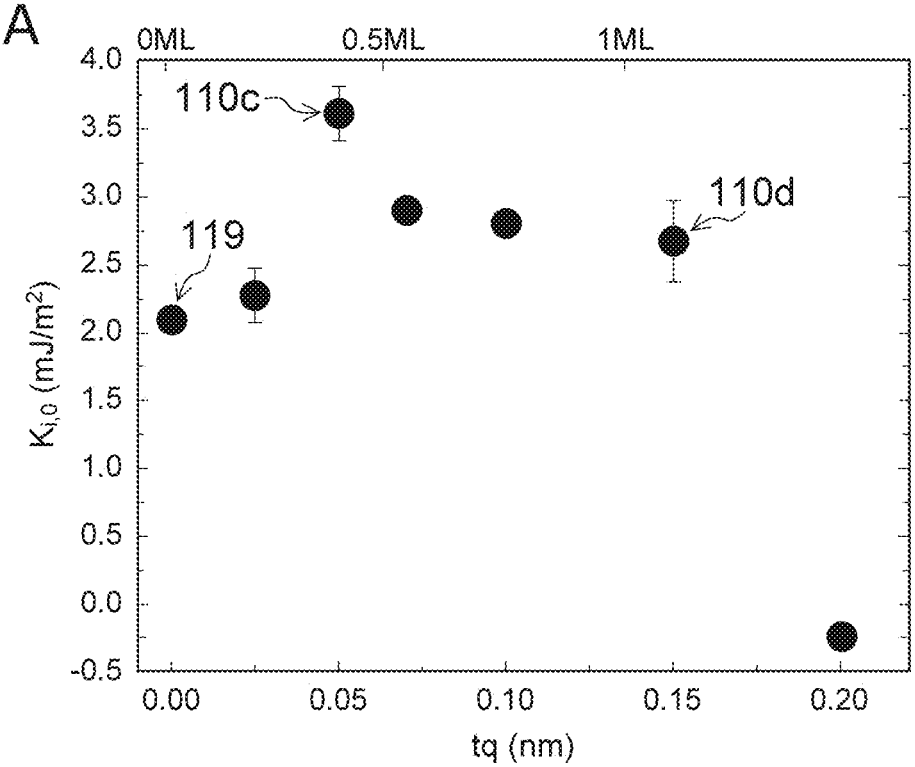
FIG. 4A and FIG. 4B are graphs showing experimental results.
Figure 4B:
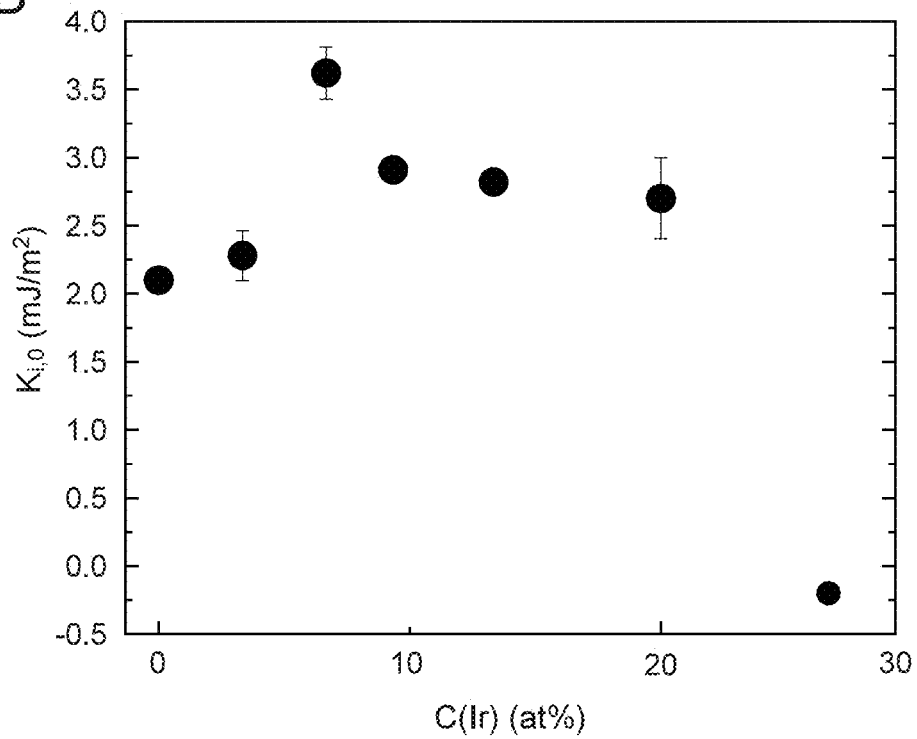

FIG. 4A and FIG. 4B are graphs showing experimental results.

The horizontal axis of FIG. 4A is the thickness tq (nm) of the Ir film 10q. The horizontal axis of FIG. 4B is a composition ratio C (Ir) (atomic percent: at %) of Ir in the first layer 10. In these figures, the vertical axis is the interface magnetic anisotropy $K_{i,0}$ (mJ/m$^2$). In FIG. 4A, the value when the thickness tq is 0 corresponds to the sample 119 in which the Ir film 10q is not provided. The value when the thickness tq is 0.05 nm corresponds to the sample 110c. The value when the thickness tq is 0.15 nm corresponds to the sample 110d.

As shown in FIG. 4A, the interface magnetic anisotropy $K_{i,0}$ is about 2 mJ/m$^2$ and is low in the sample 119 in which the Ir film 10q is not provided (the thickness tq is 0).

Conversely, a high interface magnetic anisotropy $K_{i,0}$ is obtained when the Ir film 10q is provided. For example, for the sample 110c in which the thickness tq of the Ir film 10q is 0.05 nm, the interface magnetic anisotropy $K_{i,0}$ is 3.7 mJ/m$^2$ and is extremely high. From FIG. 4A, it can be seen that a high interface magnetic anisotropy $K_{i,0}$ is obtained when the thickness tq of the Ir film 10q is not less than 0.025 nm and not more than 0.15 nm. For example, the interface magnetic anisotropy $K_{i,0}$ is 2.8 mJ/m$^2$ when the thickness tq is about 0.07 nm.

As shown in FIG. 4A, the interface magnetic anisotropy $K_{i,0}$ is negative when the thickness tq of the Ir film 10q is 0.2 nm. The characteristic of the interface magnetic anisotropy $K_{i,0}$ is critical in the range where the thickness tq is 0.15 nm to 0.2 nm.

In the experiment samples as described above, the region (the first layer 10) that includes Fe and Ir is obtained by forming the Fe film 10p and the Ir film 10q and by subsequently performing heat treatment. For the samples illustrated in FIG. 4A, the thickness tm of the first layer 10 is about 0.70 nm to 1.25 nm for the sample in which the thickness tq of the Ir film 10q is 0.05 nm. The thickness tm of the first layer 10 is about 0.95 nm to 1.55 nm for the sample in which the thickness tq of the Ir film 10q is 0.15 nm.

In the embodiment, a high perpendicular magnetic anisotropy energy $K_{eff}$ is obtained when the thickness tm of the region (the first layer 10) including Fe and Ir is not less than 0.26 nm and not more than 2 nm.

The thickness tm of about 0.13 nm corresponds to a thickness of 1 atomic layer (1 ML: monoatomic layer). In the embodiment, for example, a high interface magnetic anisotropy $K_{i,0}$ is obtained when the thickness tm of the region (the first layer 10) including Fe and Ir is a thickness corresponding to 2 atomic layers.

In the experiment samples recited above, the thickness tq of the Ir film 10q substantially corresponds to the composition ratio of Ir in the region (the first layer 10) including Fe and Ir.

FIG. 4B shows the relationship between the composition ratio C (Ir) of Ir in the first layer 10 and the interface magnetic anisotropy $K_{i,0}$ for the multiple samples illustrated in FIG. 4A. As shown in FIG. 4B, a high interface magnetic anisotropy $K_{i,0}$ is obtained when the composition ratio C (Ir) of Ir in the first layer 10 is not less than 3 at % and not more than 25 at %.

In the embodiment, the concentration of the second element (e.g., Ir) in the first layer 10 is not less than 3 at % and not more than 25 at %. Thereby, a high interface magnetic anisotropy $K_{i,0}$ is obtained. In the embodiment, the concentration of the second element (e.g., Ir) in the first layer 10 may be not less than 5 at % and not more than 20 at %. A higher interface magnetic anisotropy $K_{i,0}$ is obtained. In the embodiment, the concentration of the second element (e.g., Ir) in the first layer 10 may be not less than 5 at % and not more than 12 at %. A higher interface magnetic anisotropy $K_{i,0}$ is obtained stably.

In the experiment recited above, the Ir composition ratio in the region (the first layer 10) including Fe and Ir is modified by modifying the thickness tq of the Ir film 10q. Therefore, in the first layer 10, the composition ratio of Ir may change in the thickness direction (the Z-axis direction). For example, the composition ratio of Ir in a region of the first layer 10 proximal to the second layer 20 is higher than the composition ratio of Ir in a region of the first layer 10 distal to the second layer 20. In the embodiment, the composition ratio of Ir in the first layer 10 may be substantially constant.

FIG. 5A to FIG. 5D are a schematic view and photographs illustrating analysis results of the sample.

Figures 5A, 5B, 5C, 5D:
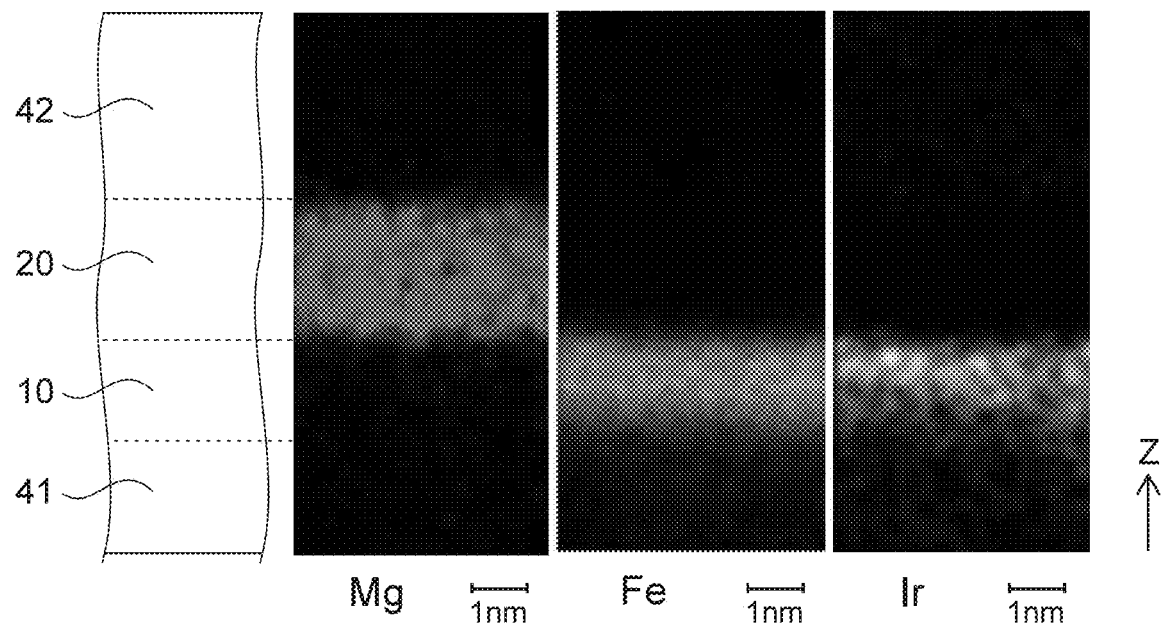
FIG. 5A to FIG. 5D are a schematic view and photographs illustrating analysis results of the sample.

FIG. 5B to FIG. 5D are STEM-EDS (Scanning transmission electron microscopy-Energy dispersive spectroscopy) elemental mapping of the sample 110c recited above. FIG. 5B to FIG. 5D correspond respectively to Mg, Fe, and Ir. The position in the Z-axis direction in FIG. 5B to FIG. 5D corresponds to the position illustrated in FIG. 5A.

It can be seen from these figures that the first layer 10 substantially contacts the second layer 20. From FIG. 5C and FIG. 5D, it can be seen that the distribution of Ir is substantially equal to the distribution of Fe. The existence of Ir inside the first layer 10 is dispersed relatively uniformly.

Figures 6A, 6B:
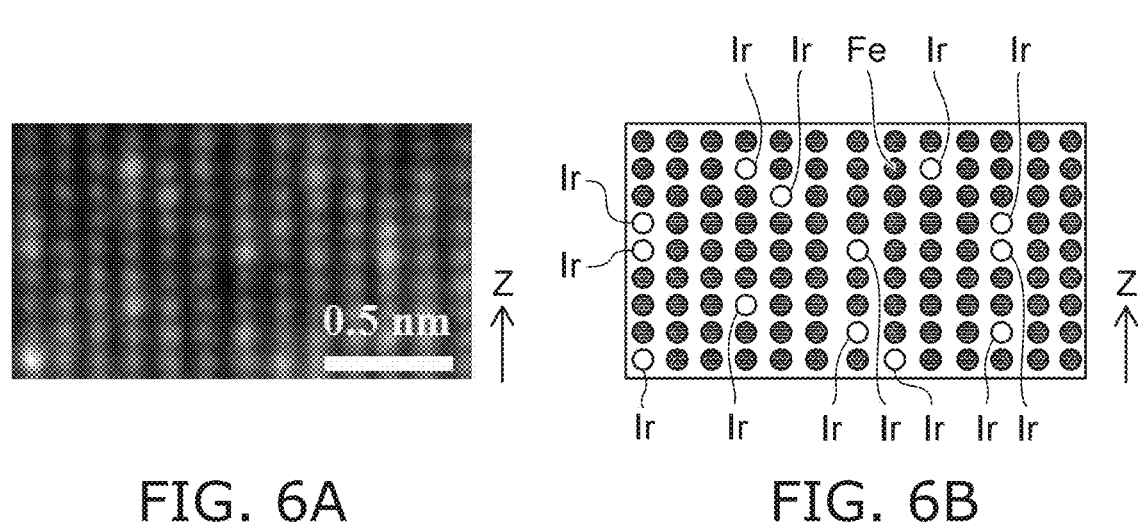
FIG. 6A and FIG. 6B are a photograph and a schematic view illustrating analysis results of the sample.

FIG. 6A and FIG. 6B are a photograph and a schematic view illustrating analysis results of the sample. FIG. 6A is a Z-contrast HAADF (High-Angle Annular Dark Field) STM image of the first layer 10. In FIG. 6A, the light dot-shaped portions correspond to the Ir atoms. The dot-shaped regions that have low brightness correspond to the Fe atoms. FIG. 6B is a schematic view drawn based on FIG. 6A.

It can be seen from these figures that the Ir is dispersed substantially randomly in the first layer 10. The Ir exists substantially uniformly in the first layer 10. The Fe is replaced with Ir at sites in the crystal lattice.

As the method for forming the first layer 10 in the embodiment, for example, a film that includes the first element (at least one selected from the group consisting of Fe, Co, and Ni) and the second element (at least one selected from the group consisting of Ir and Os) may be formed. For example, the film that includes the first element and the second element can be formed on a base body by molecular beam epitaxy, sputtering, etc. In such a case, the composition ratio of the second element inside the formed film can be relatively uniform. Heat treatment may be performed as necessary after such film formation.

For example, in the case where the first layer 10 is formed by a method of forming the film including the first element and the second element on the base body, the composition ratio of the second element (e.g., Ir) in the first layer 10 may be not less than 3 at % and not more than 25 at %. A high interface magnetic anisotropy $K_{i,0}$ is obtained for such a composition ratio.

A stable perpendicular magnetic anisotropy is obtained by the high interface magnetic anisotropy $K_{i,0}$. Thereby, a magnetic element can be provided in which the operational stability can be improved. For example, a magnetic memory device and a magnetic sensor can be provided in which the operational stability can be improved.

An example of a control of the magnetic anisotropy by a voltage will now be described.

Figure 7A:
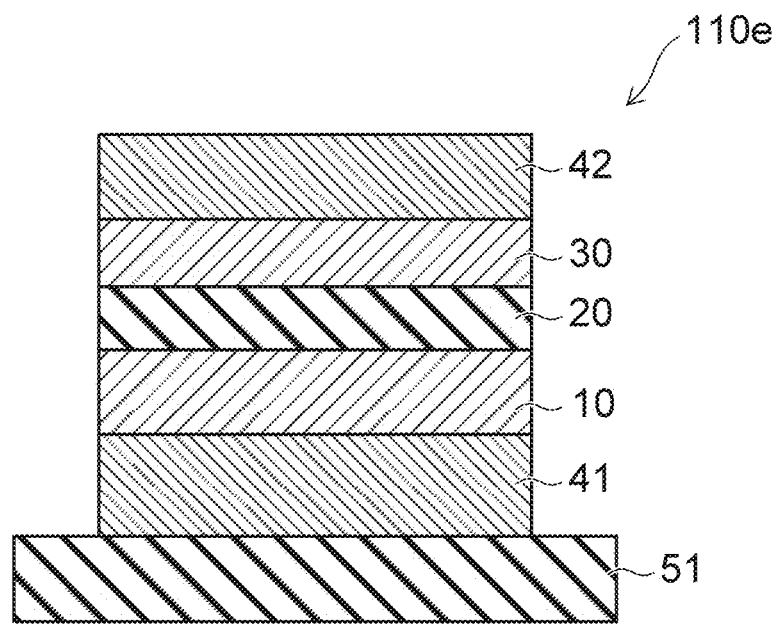
FIG. 7A and FIG. 7B are schematic views showing an experiment relating to the voltage control of the magnetic anisotropy.
Figure 7B:
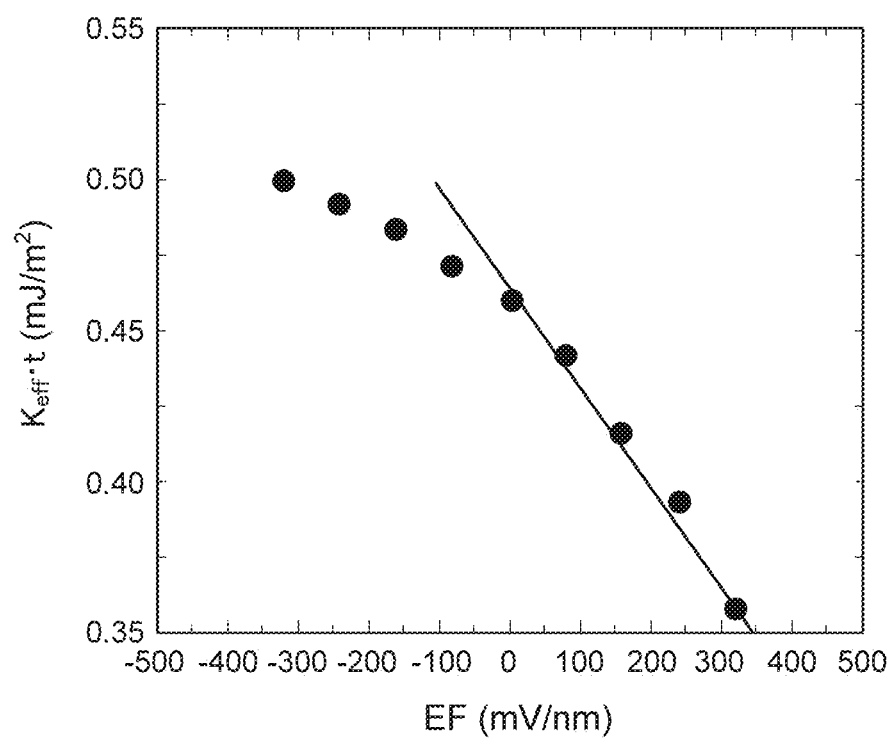

FIG. 7A and FIG. 7B are schematic views showing an experiment relating to the voltage control of the magnetic anisotropy.

FIG. 7A is a cross-sectional view showing the sample of the experiment. FIG. 7B is a cross-sectional view showing the experimental results.

In a sample 110e as shown in FIG. 7A, a Cr film (having a thickness of 30 nm) that is used to form the first conductive layer 41 is provided on the substrate 51 (MgO having the (001) orientation). The Fe film 10p (having the thickness tp of 0.77 nm) is formed on the first conductive layer 41; further, the Ir film 10q (having the thickness tq of 0.05 nm) is provided on the Fe film 10p. A MgO film (having a thickness of about 2.3 nm) that is used to form the second layer 20 is provided on the Ir film 10q. An Fe film (having a thickness of about 10 nm) that is used to form the third layer 30 is provided on the MgO film. A Ta film (having a thickness of 5 nm) and a Ru film (having a thickness of 7 nm) that are used to form the second conductive layer 42 are provided on the Fe film. The Ta film is positioned between the Ru film and the MgO film. After forming such a stacked film, heat treatment is performed for 20 minutes at 350° C. Thereby, the region (the first layer 10) that includes Fe and Ir is formed from the Fe film 10p and the Ir film 10q. In the example, the Fe film that is used to form the third layer 30 is an in-plane magnetization film. The third layer 30 functions as a reference layer.

The stacked film is patterned by photolithography and ion milling using Ar. Thereby, an element sample is obtained, and the length in the X-axis direction of the element sample is about 2 μm. The length in the Y-axis direction of the element sample is about 6 μm.

The magnetoresistance effect of the element sample is measured. In the measurement, an in-plane magnetic field is applied to the element sample; and a DC two-terminal measurement is performed. In the measurement, the intensity of the voltage applied to the element sample (the voltage between the first conductive layer 41 and the second conductive layer 42) is modified. The degree of the change of the magnetic anisotropy of the FeIr film (the first layer 10) due to the applied voltage is estimated thereby.

FIG. 7B illustrates the measurement results of a characteristic of the parameter "$K_{eff}$·t."

The horizontal axis of FIG. 7B is an electric field intensity EF (mV/nm) based on the applied voltage. When the electric field intensity EF is positive, the potential of the second conductive layer 42 is higher than the potential of the first conductive layer 41. At this time, a current can flow from the second conductive layer 42 toward the first conductive layer 41. The electric field intensity EF is the applied voltage/"2.3 nm which is the thickness of the MgO film."

The vertical axis of FIG. 7B is the parameter "$K_{eff}$·t." The thickness t corresponds to the thickness tm of the first layer 10; and in the example, the thickness t is the sum of the thickness tp (0.77 nm) of the Fe film 10p and the thickness tq (0.05 nm) of the Ir film 10q.

As shown in FIG. 7B, the change of the parameter "$K_{eff}$·t" is dependent on the electric field intensity EF. For example, when the electric field intensity EF is positive, the parameter "$K_{eff}$·t" changes substantially linearly with respect to the electric field intensity EF. The slope of the parameter "$K_{eff}$·t" is estimated to be 320 fJ/Vm from the change of the parameter "$K_{eff}$·t" when the electric field intensity EF is positive.

It was found that by using the first layer 10 recited above in the magnetic element 110 according to the embodiment, the parameter "$K_{eff}$·t" changes according to the electric field intensity EF. Also, the slope of the parameter "$K_{eff}$·t" is 320 fJ/Vm and is high. The slope is about 3 times the slope of a sample including a MgO film and an Fe film not including Ir. In the embodiment, the magnetic anisotropy can be controlled with high controllability by the applied voltage.

Thus, a high interface magnetic anisotropy $K_{i,0}$ is obtained in the magnetic element 110 according to the embodiment. Further, in the magnetic element 110, the magnetic anisotropy can be controlled with good controllability by the voltage. For example, a stable operation of the voltage-controlled magnetic memory device is obtained.

According to the embodiment, for example, the scalability of voltage-controlled MRAM (Magnetoresistive Random Access Memory) applicable to cache memory, etc., can be realized.

In the embodiment, an in-plane magnetization film or a perpendicular magnetization film is used as the third layer 30. For example, the rewriting of information by a voltage-induced dynamic magnetization reversal is possible by using a perpendicular magnetization film as the third layer 30. The reading of the information is possible by using the magnetoresistance effect.

In the embodiment, the major component of the first layer 10 is the first element recited above. The first layer 10 includes the second element. The first layer 10 may include a layer (a region) including the first element and a layer (a region) including the second element. Because the first layer 10 includes the second element, for example, the interface magnetic anisotropy is high at the interface with the second layer 20 (e.g., MgO). A large voltage effect is obtained by such a first layer 10. According to the embodiment, for example, good characteristics of a voltage-controlled MRAM are obtained.

The composition ratio of the second element in the first layer 10 is, for example, not less than 3 at % and not more than 25 at %. Thereby, for example, good ferromagnetic properties are obtained at room temperature.

For example, the first layer 10 has a body-centered cubic (bcc) structure. The first layer 10 includes, for example, at least one of a single crystal or a polycrystal. For example, the polycrystal is preferentially oriented in the (001) plane. For example, multiple crystal grains that are included in the polycrystal statistically have a designated direction (in the example, the direction of the (001) plane). For example, the (001) plane of at least a portion of the first layer 10 is along a plane perpendicular to the Z-axis direction (the stacking direction). The angle between the (001) plane and the plane perpendicular to the Z-axis direction (the stacking direction) is smaller than the angle between the (001) plane and the Z-axis direction. For example, multiple magnetic elements (memory cells) are provided in one magnetic memory device. The first layer 10 is provided in each of the multiple magnetic elements. When the multiple first layers 10 included in the one magnetic memory device are considered to be one layer, this layer includes, for example, a polycrystal. For example, this one layer (the multiple first layers 10) is preferentially oriented in the (001) plane. For example, a crystal is included in each of the multiple first layers 10. The distribution of the orientations of the multiple crystals (the first layers 10) has a bias. The angle is less than 45 degrees between the Z-axis direction and the statistically preferential direction (a direction perpendicular to the (001) plane) of the orientations of the multiple crystals (the multiple first layers 10).

For example, the film that is used to form the first layer 10 may have an amorphous structure. A crystalline first layer 10 may be formed by crystallizing the film used to form the first layer 10 by using a solid phase epitaxy process using heat treatment (post anneal processing). Even in such a case, at least a portion of the first layer 10 has a bcc structure. For example, an amorphous film is obtained using a material including B (boron); and the bcc structure is obtained by heat treatment.

In the embodiment, the thickness tm of the first layer 10 is, for example, not less than a thickness corresponding to 2 atomic layers. The thickness tm of the first layer 10 is 2 nm or less. By such a thickness tm, for example, interface effects are obtained appropriately. Thereby, for example, the control of the magnetic anisotropy by the voltage is obtained effectively.

For example, the second layer 20 induces the change of the magnetic anisotropy due to the voltage by being used with the first layer 10. The second layer 20 includes at least one of a single crystal or a polycrystal. For example, the polycrystal is preferentially oriented in the (001) plane. In the case where the second layer 20 is a single crystal, the (001) plane of the single crystal is along a plane perpendicular to the Z-axis direction. The angle between the (001) plane and the plane perpendicular to the Z-axis direction (the stacking direction) is smaller than the angle between the (001) plane and the Z-axis direction. For example, good crystallinity is obtained between the first layer 10 and the second layer 20.

The resistance·area (RA: Resistance area product) of the second layer 20 is, for example, 10 $\Omega\mu m^2$ or more. Thereby, for example, a low power consumption is obtained in the voltage control operation. The resistance·area of the second layer 20 may be, for example, greater than 20 $\Omega\mu m^2$. Thereby, for example, a low power consumption that is ½ of the case of a current write operation is obtained. The resistance·area of the second layer 20 may be, for example, 100 $\Omega\mu m^2$ or more. Thereby, for example, an even lower power consumption that is 1/10 of the case of a current write operation is obtained. The energy that is necessary to write increases abruptly when the resistance-area of the second layer 20 becomes 20 $\Omega\mu m^2$ or less. The increase of the energy necessary to write accelerates further when the resistance·area of the second layer 20 becomes less than 10 $\Omega\mu m^2$.

Figure 8A:
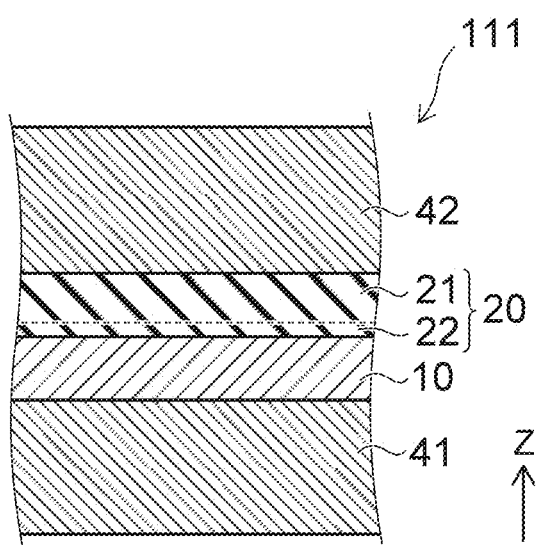
FIG. 8A and FIG. 8B are schematic cross-sectional views illustrating other magnetic elements according to the first embodiment.
Figure 8B:
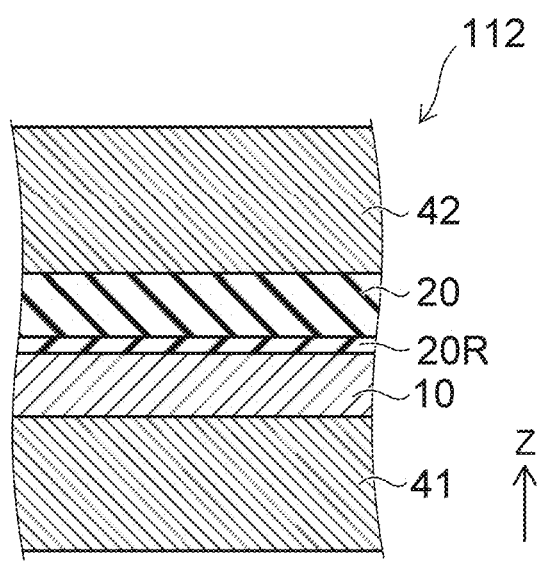

FIG. 8A and FIG. 8B are schematic cross-sectional views illustrating other magnetic elements according to the first embodiment.

In another magnetic element 111 according to the embodiment as shown in FIG. 8A, the second layer 20 includes a first partial region 21 and a second partial region 22. The second partial region 22 is provided between the first partial region 21 and the first layer 10. The first partial region 21 includes, for example, at least one of an oxide of a third element including at least one selected from the group consisting of Mg, Si, Al, Ti, Zr, Hf, Ta, Zn, Sr, and Ba, a nitride of the third element, or a fluoride of the third element. The second partial region 22 includes, for example, a fourth element including at least one selected from the group consisting of Mg, Si, Al, Ti, Zr, Hf, Ta, Zn, Sr, and Ba. The concentration of the fourth element in the second partial region 22 is higher than the concentration of the fourth element in the first partial region 21. For example, the first partial region 21 includes the third element recited above and a fifth element. The fifth element is at least one of oxygen, nitrogen, or fluorine. The concentration of the fifth element in the first partial region 21 is higher than the concentration of the fifth element in the second partial region 22.

For example, the second partial region 22 is a Mg film when the first partial region 21 is, for example, a MgO film. For example, the second partial region 22 may be an Al film when the first partial region 21 is a MgO film. The thickness (the length along the Z-axis direction) of the second partial region 22 is, for example, 0.3 nm or less.

For example, the degradation of the characteristics due to effects of oxidization, etc., at the interface between the first layer 10 and the second layer 20 when forming the films is suppressed by the second partial region 22. In the example, the first layer 10 contacts the second layer 20.

As shown in FIG. 8B, another magnetic element 112 according to the embodiment further includes an intermediate region 20R in addition to the first layer 10 and the second layer 20. The intermediate region 20R is provided between the first layer 10 and the second layer. The second layer 20 includes, for example, at least one of an oxide of the third element including at least one selected from the group consisting of Mg, Si, Al, Ti, Zr, Hf, Ta, Zn, Sr, and Ba, a nitride of the third element, or a fluoride of the third element. The intermediate region 20R includes, for example, the fourth element including at least one selected from the group consisting of Mg, Si, Al, Ti, Zr, Hf, Ta, Zn, Sr, and Ba. The concentration of the fourth element in the intermediate region 20R is higher than the concentration of the fourth element in the second layer 20. For example, the second layer 20 includes the third element recited above and the fifth element. The fifth element is at least one of oxygen, nitrogen, or fluorine. The concentration of the fifth element in the second layer 20 is higher than the concentration of the fifth element in the intermediate region 20R.

For example, the degradation of the characteristics due to effects of oxidization, etc., at the interface between the first layer 10 and the second layer 20 when forming films is suppressed by the intermediate region 20R. In the example, the intermediate region 20R contacts the first layer 10 and the second layer 20.

An example of simulation results of the magnetic anisotropy of the stacked body including the first layer 10 and the second layer 20 will now be described. First principle calculations are performed in the simulation. Structures of the model of the simulation will now be described.

FIG. 9A to FIG. 9D are schematic views illustrating the model of the simulation.

Figure 9A:
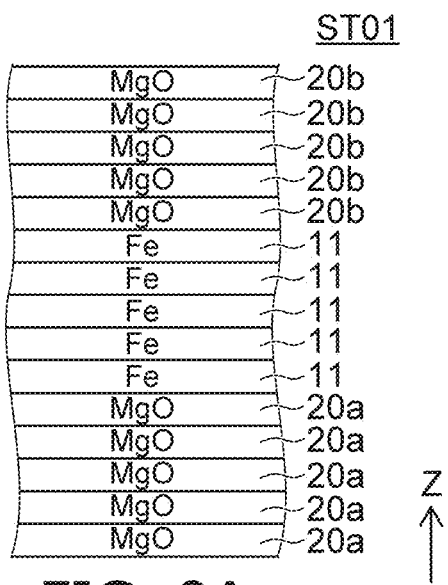
FIG. 9A to FIG. 9D are schematic views illustrating the model of the simulation.

In a structure ST01 shown in FIG. 9A, an Fe layer 11 that is 5 atomic layers thick is provided between a MgO layer 20$a$ that is 5 atomic layers thick and a MgO layer 20$b$ that is 5 atomic layers thick.

Figure 9B:
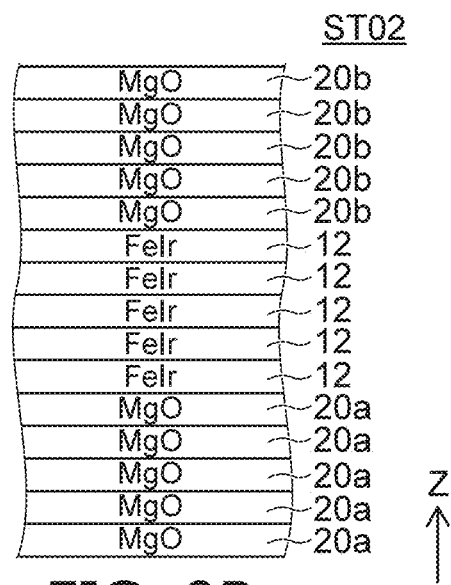

In a structure ST02 shown in FIG. 9B, an FeIr layer 12 that is 5 atomic layers thick is provided between the MgO layer 20$a$ that is 5 atomic layers thick and the MgO layer 20$b$ that is 5 atomic layers thick. In the structure ST02, the composition ratio of Ir in the entire FeIr layer 12 that is 5 atomic layers thick is 6.25 at %. The sites of the Ir atoms are arranged randomly in the same FeIr plane while maintaining a composition ratio of 6.25%.

Figure 9C:
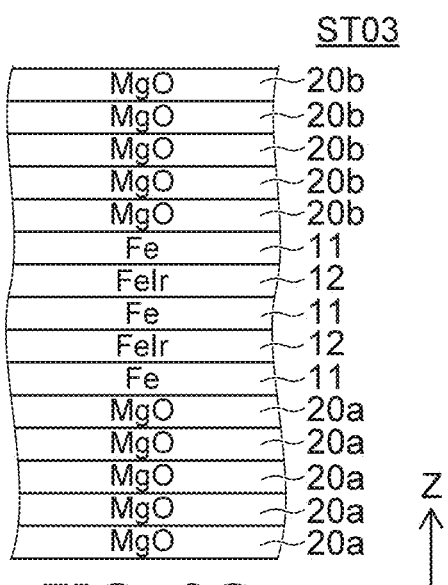

In a structure ST03 shown in FIG. 9C, the Fe layer 11 that is 1 atomic layer thick and the FeIr layer 12 that is 1 atomic layer thick are provided alternately between the MgO layer 20$a$ that is 5 atomic layers thick and the MgO layer 20$b$ that is 5 atomic layers thick. The number of the Fe layers 11 is 3; and the number of the FeIr layers 12 is 2. In the structure ST03, the composition ratio of Ir in the entire region including the three Fe layers 11 and the two FeIr layers 12 is 6.25 at %. The sites of the Ir atoms are arranged randomly in the same FeIr plane while maintaining a composition ratio of 6.25%.

Figure 9D:
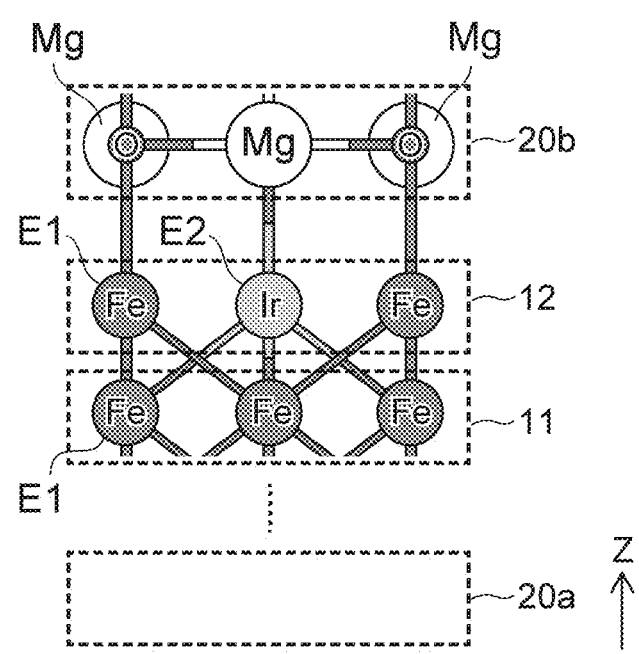

In one MgO layer 20$a$ (or MgO layer 20$b$) as shown in FIG. 9D, Mg atoms and O atoms are arranged along the plane perpendicular to the Z-axis direction. In one Fe layer 11, multiple Fe atoms (a first element E1) are arranged along the plane perpendicular to the Z-axis direction. In one FeIr layer 12, the Fe atoms (the first element E1) and the Ir atoms (a second element E2) are arranged along the plane perpendicular to the Z-axis direction. In one FeIr layer 12, the direction from the first element E1 toward the second element E2 along the plane perpendicular to the Z-axis direction crosses (e.g., is perpendicular to) the Z-axis direction (the stacking direction).

A perpendicular magnetic anisotropy MAE (mJ/m$_2$) is determined by first principle calculations for each of such structures. The level of the perpendicular magnetic anisotropy MAE corresponds to the level of the interface magnetic anisotropy $K_{i,0}$ (the measured value) described in reference to FIG. 4. Hereinbelow, normalized values are used as the perpendicular magnetic anisotropies MAE of the other structures by setting the perpendicular magnetic anisotropy MAE of the structure ST01 to 1.

The perpendicular magnetic anisotropy MAE (the normalized value) of the structure ST01 is 1.

The perpendicular magnetic anisotropy MAE (the normalized value) of the structure ST02 is 1.11.

The perpendicular magnetic anisotropy MAE (the normalized value) of the structure ST03 is 1.51.

The structure ST01 does not include the second element E2 (in the example, Ir); and the structure ST01 corresponds to the sample 119 recited above. The structure ST02 and the structure ST03 include the second element E2 and correspond to the samples 110$c$, 110$d$, 110$e$, etc.

Thus, a high perpendicular magnetic anisotropy MAE is obtained by providing the first layer 10 including the second element E2 (in the example recited above, Ir).

Figure 10A:
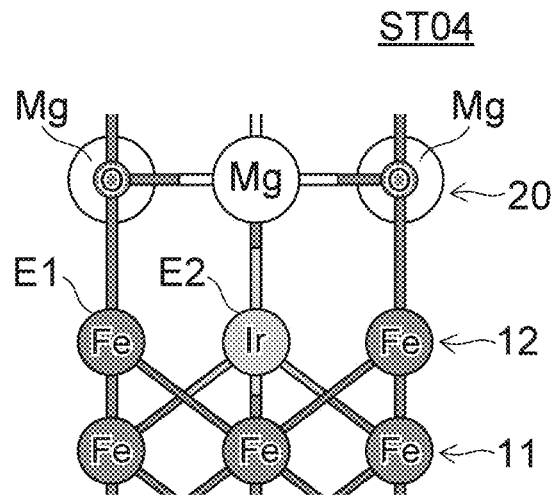
FIG. 10A and FIG. 10B are schematic views illustrating another model of the simulation.
Figure 10B:
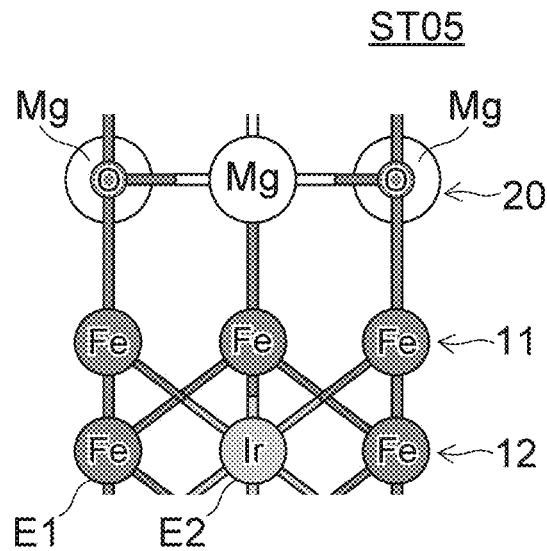

FIG. 10A and FIG. 10B are schematic views illustrating another model of the simulation.

In the model shown in FIG. 10A and FIG. 10B, a MgO layer (the second layer 20) that is 1 atomic layer thick, the Fe layer 11 that is 1 atomic layer thick, and the FeIr layer 12 that is 1 atomic layer thick are provided. In a structure ST04 shown in FIG. 10A. The FeIr layer 12 is positioned between the MgO layer (the second layer 20) and the Fe layer 11. In a structure ST05 shown in FIG. 10B. The Fe layer 11 is positioned between the MgO layer (the second layer 20) and the FeIr layer 12.

The perpendicular magnetic anisotropy MAE (mJ/m$_2$) is determined by first principle calculations for each of such structures. In this case as well, normalized values are used as the perpendicular magnetic anisotropies MAE by setting, to 1, the perpendicular magnetic anisotropy MAE of the case where the FeIr layer 12 is not provided.

The perpendicular magnetic anisotropy MAE (the normalized value) of the structure ST04 is 2.43.

The perpendicular magnetic anisotropy MAE (the normalized value) of the structure ST05 is 1.85.

Figure 11A:
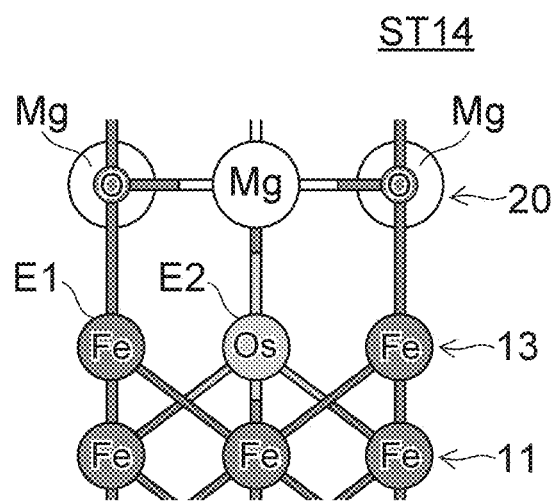
FIG. 11A and FIG. 11B are schematic views illustrating another model of the simulation.
Figure 11B:
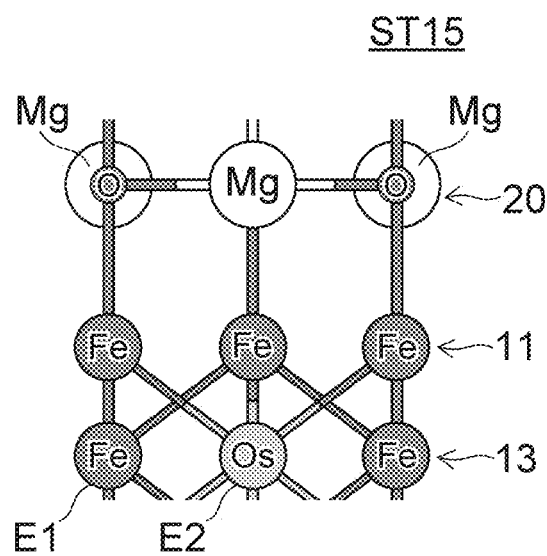

FIG. 11A and FIG. 11B are schematic views illustrating another model of the simulation.

In the model shown in FIG. 11A and FIG. 11B, a MgO layer (the second layer 20) that is 1 atomic layer thick, the Fe layer 11 that is 1 atomic layer thick, and an FeOs layer 13 that is 1 atomic layer thick are provided. In the example, the second element is Os. In a structure ST14 shown in FIG. 11A. The FeOs layer 13 is positioned between the MgO layer (the second layer 20) and the Fe layer 11. In a structure ST15 shown in FIG. 11B. The Fe layer 11 is positioned between the MgO layer (the second layer 20) and the FeOs layer 13.

The perpendicular magnetic anisotropy MAE (mJ/m$_2$) is determined by first principle calculations for each of such structures. In this case as well, normalized values are used as the perpendicular magnetic anisotropies MAE by setting, to 1, the perpendicular magnetic anisotropy MAE of the case where the FeOs layer 13 is not provided.

The perpendicular magnetic anisotropy MAE (the normalized value) of the structure ST14 is 2.68.

The perpendicular magnetic anisotropy MAE (the normalized value) of the structure ST15 is 3.77.

Thus, a high perpendicular magnetic anisotropy MAE is obtained even in the case where Os is used as the second element E2.

In the embodiment, the first layer 10 includes at least one selected from the group consisting of Ir and Os as the second element E2. A high perpendicular magnetic anisotropy MAE is obtained thereby.

In the embodiment, as in the structures ST03, ST04, ST05, ST14, and ST15, for example, a layer of the first element E1 (e.g., the Fe layer 11) and a layer including the first element E1 and the second element E2 (e.g., the FeIr layer 12, the FeOs layer 13, etc.) may be stacked.

For example, as in the structure ST04, a high perpendicular magnetic anisotropy MAE is obtained in the case where the Fe layer 11 is provided between the FeIr layer 12 and the MgO layer (the second layer 20).

Figure 12:
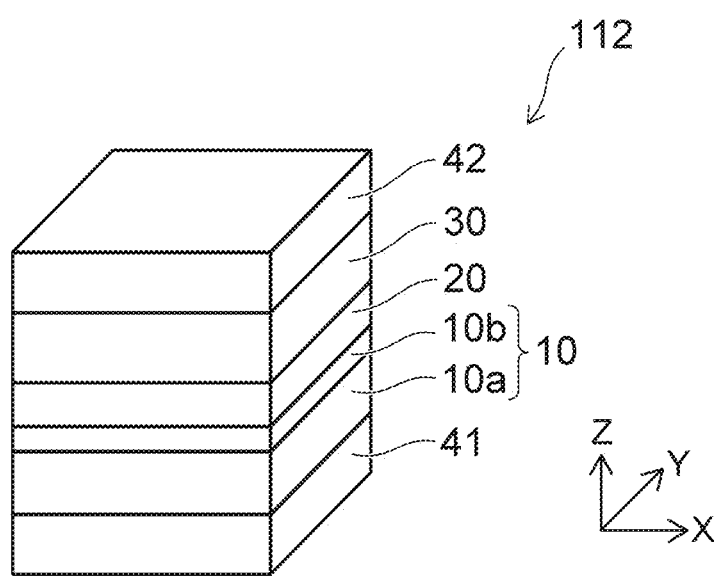
FIG. 12 is a schematic perspective view illustrating another magnetic element according to the first embodiment.

FIG. 12 is a schematic perspective view illustrating another magnetic element according to the first embodiment.

As shown in FIG. 12, the first layer 10 and the second layer 20 are provided in the magnetic element 112 as well. In the example, the third layer 30, the first conductive layer 41, and the second conductive layer 42 are further provided. In the magnetic element 112, the first layer 10 includes a first region 10a and a second region 10b. Otherwise, for example, the configuration is similar to that of the magnetic element 110; and a description is therefore omitted.

In the first layer 10 of the magnetic element 112, the second region 10b is positioned between the first region 10a and the second layer 20. The first region 10a includes the first element E1 (e.g., Fe) and the second element E2 (e.g., at least one of Ir or Os). On the other hand, the second region 10b includes the first element E1. The concentration (the composition ratio) of the second element E2 in the second region 10b is low. For example, the second region 10b may not include the second element E2.

For example, the concentration of the second element E2 in the second region 10b is lower than the concentration of the second element E2 in the first region 10a. Or, the second region 10b does not include the second element E2. The first region 10b is, for example, the FeIr layer 12 or the FeOs layer 13. The second region 10b is, for example, the Fe layer 11.

For example, the thickness of the second region 10b is 0.3 nm or less. The thickness of the second region 10b may be, for example, not more than a thickness corresponding to 3 atomic layers. For example, the second region 10b contacts the second layer 20.

By providing such a first region 10a and such a second region 10b, a high perpendicular magnetic anisotropy MAE is obtained as described in reference to the structures ST03, ST05, and ST15 recited above.

For example, the first region 10a corresponds to the FeIr layer 12, the FeOs layer 13, etc. For example, as shown in FIG. 10B and FIG. 11B, the direction from the first element E1 included in the first region 10a (the FeIr layer 12 or the FeOs layer 13) toward the second element E2 included in the first region 10a is along a plane substantially perpendicular to the Z-axis direction (the first direction from the first region 10a toward the second layer 20).

For example, the absolute value of the angle between the Z-axis direction (the first direction recited above) and the direction from the first element E1 included in the first region 10a toward the second element E2 included in the first region 10a is not less than 70 degrees and not more than 110 degrees.

For example, the second region 10b (e.g., the layer including the first element E1) has a body-centered cubic (bcc) structure. At least a portion of the second region 10b is substantially a single crystal having the (001) plane orientation. Or, at least a portion of the second region 10b includes a polycrystal that is preferentially oriented in the (001) plane.

FIG. 13A to FIG. 13F are schematic cross-sectional views illustrating other magnetic elements according to the first embodiment.

Figure 13A:
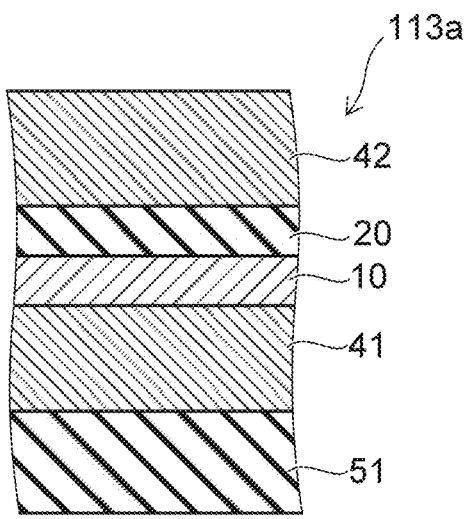
FIG. 13A to FIG. 13F are schematic cross-sectional views illustrating other magnetic elements according to the first embodiment.
Figure 13B:
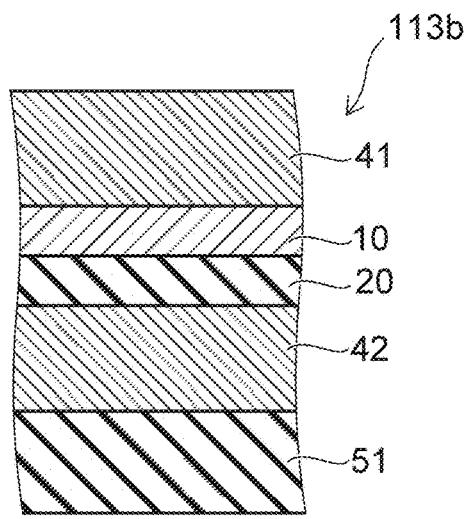
Figure 13C:
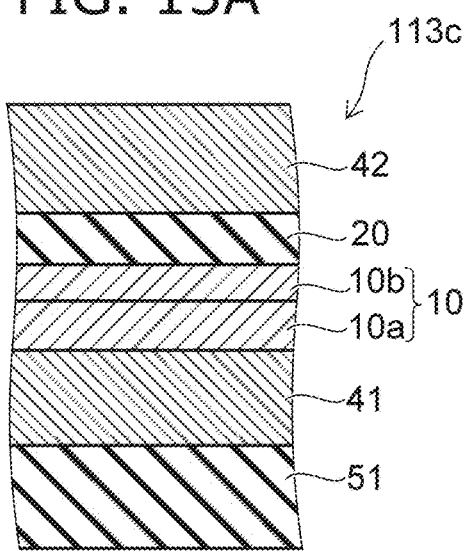
Figure 13D:
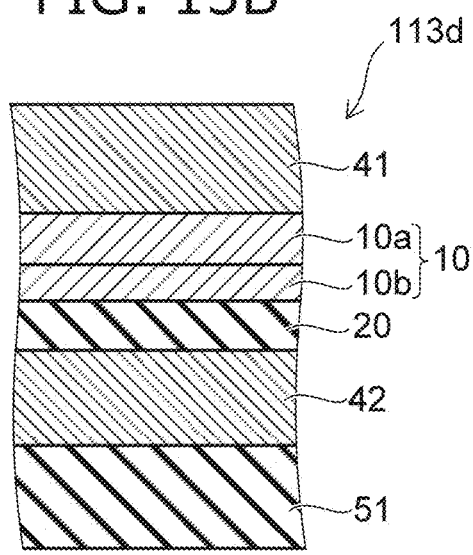
Figure 13E:
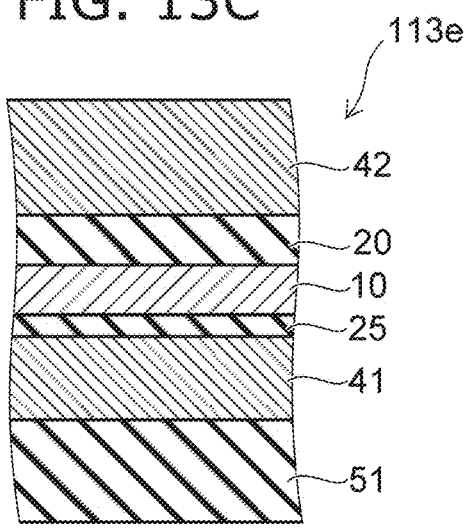

In magnetic elements 113a, 113c, and 113e as shown in FIG. 13A, FIG. 13C, and FIG. 13E, the first conductive layer 41 is provided between the substrate 51 and the second conductive layer 42. The first layer 10 is provided between the first conductive layer 41 and the second conductive layer 42. The second layer 20 is provided between the first layer 10 and the second conductive layer 42. In the magnetic element 113c, the second region 10b is provided between the first region 10a and the second layer 20.

Figure 13F:
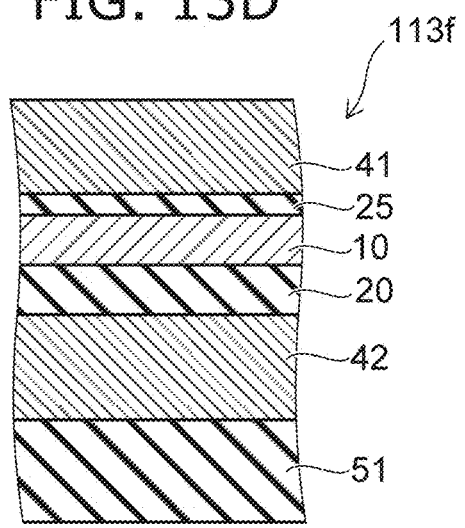

In magnetic elements 113b, 113d, and 113f as shown in FIG. 13B, FIG. 13D, and FIG. 13F, the second conductive layer 42 is provided between the substrate 51 and the first conductive layer 41. The first layer 10 is provided between the first conductive layer 41 and the second conductive layer 42. The second layer 20 is provided between the first layer 10 and the second conductive layer 42. In the magnetic element 113d, the second region 10b is provided between the first region 10a and the second layer 20.

As shown in FIG. 13E and FIG. 13F, the magnetic elements 113e and 113f further include a nonmagnetic layer 25. The first layer 10 is positioned between the nonmagnetic layer 25 and the second layer 20. The nonmagnetic layer includes at least one of an oxide of a sixth element including at least one selected from the group consisting of Mg, Si, Al, Ti, Zr, Hf, Ta, Zn, Sr, and Ba, a nitride of the sixth element, or a fluoride of the sixth element. The nonmagnetic layer 25 is, for example, a MgO film. For example, the magnetic anisotropy of the first layer 10 can be increased by the nonmagnetic layer 25. In the examples of the magnetic elements 113e and 113f, the nonmagnetic layer 25 contacts the first conductive layer 41 and the first layer 10.

In the magnetic elements 113a to 113f, the third layer 30 may be provided between the second layer 20 and the second conductive layer 42.

In the embodiment, for example, the layers that are included in the magnetic element are formed by MBE. Or, for example, the layers may be formed by physical deposition (PVD) such as sputtering, etc. Or, the layers may be formed by chemical deposition (CVD). For example, the first layer 10 can be formed utilizing mutual diffusion of the second element (e.g., Ir) by heat treatment (annealing). The first layer 10 may be formed by simultaneous vapor deposition or simultaneous sputtering of the first element (e.g., Fe) and the second element (Ir). According to these methods, it is easy for the composition ratio, etc., of the second element (e.g., Ir, etc.) inside the first layer 10 to be more uniform. For example, these methods are suited to mass production.

The second layer 20 includes, for example, single-crystal MgO. For example, the MgO has a substantially (001) orientation. For example, the second layer 20 may include polycrystalline magnesium oxide. For example, the polycrystal is preferentially oriented in the (001) crystal plane.

For example, compared to a single-crystal layer, a polycrystalline layer formed by sputtering is advantageous from the perspective of manufacturing cost.

In the magnetic elements 113a and 113c, the first conductive layer 41 is, for example, a foundation layer. For example, good flatness of the first layer 10 is obtained by using an appropriate foundation layer. For example, from the foundation layer, the first layer 10 can be provided with interface magnetic anisotropy. A high perpendicular magnetic anisotropy is obtained thereby. The foundation layer includes, for example, a heavy metal film. The heavy metal film includes, for example, at least one selected from the group consisting of Ta, Ru, Ir, Mo, and Hf. The foundation layer includes a low-resistance metal film. The low-resistance metal film includes, for example, at least one selected from the group consisting of Cu, Au, and Ag. The foundation layer may include a stacked film including the heavy metal film recited above and the low-resistance metal film recited above. For example, the first conductive layer 41 functions as an electrode.

In the magnetic elements 113a and 113c, for example, the second conductive layer 42 functions as an electrode. For example, the second conductive layer 42 may function as a capping layer. For example, the capping layer suppresses the degradation of the stacked body including the first layer 10 and the second layer 20. The capping layer includes, for example, at least one selected from the group consisting of Ta, Ru, Au, Ag, and Cu. An oxide may be used as the second conductive layer 42. The oxide includes, for example, ITO. For example, the second conductive layer 42 may be light-transmissive.

As described above, the third layer 30 that is used as a reference layer may be provided between the second layer 20 and the second conductive layer 42. In such a case, the second conductive layer 42 (the capping layer) protects the third layer 30.

The third layer 30 includes, for example, a magnetic film including at least one selected from the group consisting of Fe, Co, and Ni. The third layer 30 may include, for example, the magnetic film and an antiferromagnetic film. For example, the magnetic film recited above is positioned between the second layer 20 and the antiferromagnetic film. The antiferromagnetic film includes, for example, at least one selected from the group consisting of IrMn and PtMn.

In the embodiment, the substrate 51 is arbitrary. As the substrate 51, for example, a Si substrate may be used. The Si substrate may include a Si base body, and a thermal oxide film provided on the Si base body. For example, a single-crystal substrate, a plastic substrate, etc., may be used as the substrate 51. Various appropriate foundation layers can be formed on any substrate 51. For example, a stacked body that includes the first layer 10 and the second layer 20 can be formed on the foundation layer.

The configuration described in reference to the first conductive layer 41 of the magnetic element 113a is applicable to the second conductive layer 42 of the magnetic element 113b. The configuration described in reference to the second conductive layer 42 of the magnetic element 113a is applicable to the first conductive layer 41 of the magnetic element 113b.

Second Embodiment

The embodiment relates to a magnetic memory device. The magnetic recording device includes the magnetic elements and modifications of the magnetic elements according to the first embodiment.

Figure 14:
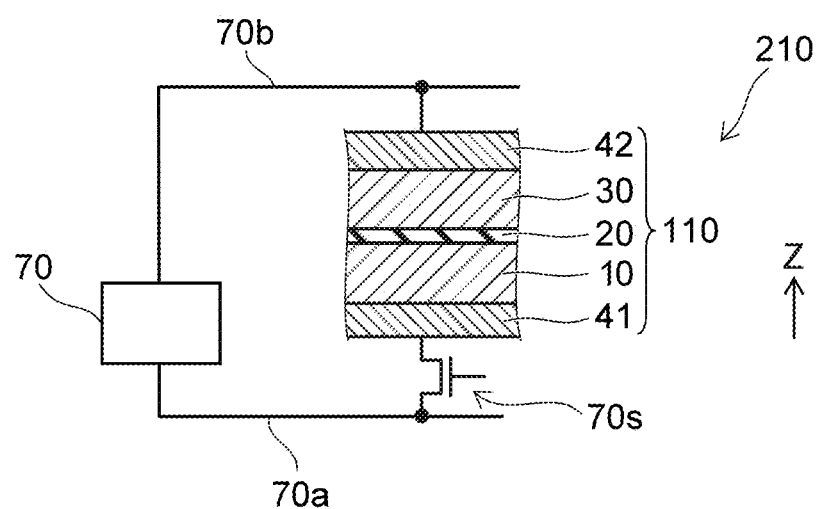
FIG. 14 is a schematic view illustrating the magnetic memory device according to the second embodiment.

FIG. 14 is a schematic view illustrating the magnetic memory device according to the second embodiment.

As shown in FIG. 14, the magnetic memory device 210 according to the embodiment includes a controller 70 and the magnetic element 110 according to the first embodiment. The magnetic element 110 includes the first layer 10 recited above, the second layer 20 recited above, and the third layer 30 recited above. The controller 70 is electrically connected to the first layer 10 and the third layer 30. In the example, the magnetic element 110 further includes the first conductive layer 41 and the second conductive layer 42. The first conductive layer 41 is electrically connected to the first layer 10. The second conductive layer 42 is electrically connected to the third layer 30.

The controller 70 is electrically connected to the first conductive layer 41 and the second conductive layer 42. In the example, the controller 70 is electrically connected to the first conductive layer 41 by a first interconnect 70a. In the example, the controller 70 is electrically connected to the second conductive layer 42 by a second interconnect 70b. In the example, a switch 70s is provided in the first interconnect 70a. The switch 70s is, for example, a select transistor, etc. Thus, the state in which a switch 70s or the like is provided in the current path also is included in the state of being electrically connected. In the description hereinbelow, the switch 70s is in the ON-state. A current flows in the interconnect in the ON-state. The switch 70s may be provided in the second interconnect 70b.

Figure 15A:
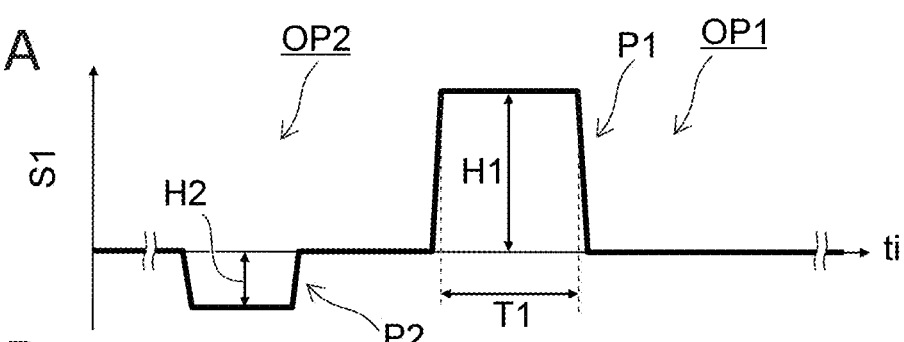
FIG. 15A to FIG. 15C are schematic views illustrating operations of the magnetic memory device according to the second embodiment.
Figure 15B:
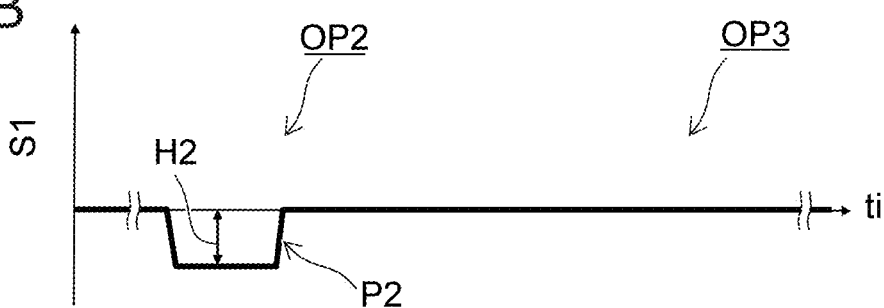
Figure 15C:
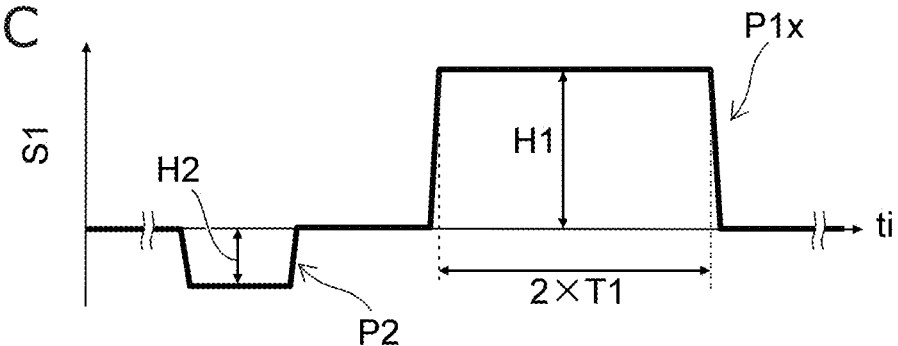

FIG. 15A to FIG. 15C are schematic views illustrating operations of the magnetic memory device according to the second embodiment.

In these figures, the horizontal axis is a time ti. In these figures, the vertical axis corresponds to a signal S1 applied between the first interconnect 70a and the second interconnect 70b. The signal S1 substantially corresponds to a signal applied between the first conductive layer 41 and the second conductive layer 42. The signal S1 substantially corresponds to a signal applied between the first layer 10 and the third layer 30.

As shown in FIG. 15A, the controller 70 performs a first operation OP1 of applying a first pulse P1 (e.g., a rewrite pulse) between the first layer 10 and the third layer 30. For example, in the first operation OP1, the controller 70 applies the first pulse P1 between the first conductive layer 41 and the second conductive layer 42. For example, in the first operation OP1, the controller 70 supplies the first pulse P1 between the first interconnect 70a and the second interconnect 70b.

The stored information is rewritten by the first pulse P1. The electrical resistance of the magnetic element 110 changes due to the first pulse P1.

For example, a second electrical resistance between the first layer 10 and the third layer 30 after the first operation OP1 is different from a first electrical resistance between the first layer 10 and the third layer 30 before the first operation OP1. The second electrical resistance between the first conductive layer 41 and the second conductive layer 42 after the first operation OP1 is different from the first electrical resistance between the first conductive layer 41 and the second conductive layer 42 before the first operation OP1.

For example, the change of the electrical resistance is based on the change of the orientation of the magnetization of at least a portion of the first layer 10 due to the first pulse P1 (the rewrite pulse). The relative relationship of the orientation of the magnetization between the first layer 10 and the third layer 30 changes due to the first pulse P1 (the rewrite pulse). Multiple states that have different electrical resistances correspond to the stored information.

A high interface magnetic anisotropy is obtained in the magnetic memory device 210 according to the embodiment. In the magnetic memory device 210, the magnetic anisotropy is controlled by a rewrite pulse. Thereby, for example, the magnetization of the first layer 10 is controlled by the rewrite pulse. For example, a stable operation is obtained in the magnetic memory device 210.

The magnetic memory device 210 according to the embodiment is, for example, a voltage torque-driven MRAM.

When rewriting the stored information in the magnetic memory device 210, the controller 70 supplies the first pulse P1 (the rewrite pulse) recited above to the magnetic element 110. For example, the first operation OP1 recited above is a rewrite operation.

As shown in FIG. 15A, the controller 70 may further perform a second operation OP2. In the second operation OP2, the controller 70 applies a second pulse P2 (a read pulse) between the first layer 10 and the third layer 30 (between the first conductive layer 41 and the second conductive layer 42, that is, between the first interconnect 70a and the second interconnect 70b) before the first operation OP1. A third electrical resistance between the first layer 10 and the third layer 30 obtained using the read pulse is different from the second electrical resistance between the first layer 10 and the third layer 30 after the first operation. The third electrical resistance is the electrical resistance before the rewriting. The second electrical resistance is the electrical resistance after the rewriting. The third electrical resistance may be the same as the first electrical resistance.

For example, the polarity of the second pulse P2 (the read pulse) is the reverse of the polarity of the first pulse P1 (the rewrite pulse). In the case where the second pulse P2 (the read pulse) having such a reverse polarity is used, the absolute value of a second pulse height H2 of the second pulse P2 may be less than, may be the same as, or may be larger than the absolute value of a first pulse height H1 of the first pulse P1 (the rewrite pulse). In the case where the magnetic anisotropy of the magnetic layer is controlled by a voltage, the change of the magnetization of the magnetic layer when reading can be suppressed by using a read pulse of the reverse polarity.

The case where the magnetic element has such characteristics is as follows. In the first operation OP1, the controller 70 applies the first pulse P1 between the first layer 10 and the third layer 30. The second electrical resistance between the first layer 10 and the third layer 30 after the first operation OP1 is different from the first electrical resistance between the first layer 10 and the third layer 30 before the first operation OP1. The first pulse P1 has a first polarity, a first pulse width T1, and the first pulse height H1. At this time, the case of applying another pulse having a second polarity that is the reverse of the first polarity, the first pulse width T1, and a pulse height having the same absolute value as the first pulse height H1 is as follows. The absolute value of the difference between the third electrical resistance between the first layer 10 and the third layer 30 after the other pulse is applied between the first layer 10 and the third layer 30 and a fourth electrical resistance before the other pulse is applied between the first layer 10 and the third layer 30 is less than the absolute value of the difference between the second electrical resistance and the first electrical resistance. In other words, the rewriting of the information is performed by the application of the first pulse P1; and the rewriting of the information does not occur due to the application of the other pulse.

The electrical resistance between the first layer 10 and the third layer 30 corresponds to the electrical resistance between a first conductive body electrically connected to the first layer 10 and a second conductive body electrically connected to the third layer 30. The change of the electrical resistance corresponds to the change of the electrical resistance between the first conductive body and the second conductive body.

When the stored information cannot be rewritten, the controller 70 performs a third operation OP3 after the second operation OP2 as shown in FIG. 15B. The first pulse P1 recited above is not applied in the third operation OP3. At this time, the rewriting does not occur.

The rewriting of the information is possible when the appropriate first pulse P1 is applied. When the appropriate first pulse P1 is applied, the electrical resistance between the first layer 10 and the third layer 30 changes from the high resistance state to the low resistance state or from the low resistance state to the high resistance state. On the other hand, in the case where an inappropriate pulse is applied, the high resistance state does not become the desired low resistance state. In the case where an inappropriate pulse is applied, the low resistance state does not become a desired high resistance state.

The pulse width of the inappropriate pulse is, for example, about 2 times the appropriate first pulse width T1. In the case where the inappropriate pulse is applied between the first layer 10 and the third layer 30, the probability of the change of the resistance occurring is low.

For example, in the first operation OP1, the controller 70 applies the first pulse P1 recited above between the first layer 10 and the third layer 30. The first pulse P1 has the first pulse width T1 and the first pulse height H1. The rewriting is performed appropriately by the first pulse P1. In other words, the second electrical resistance between the first layer 10 and the third layer 30 after the first operation OP1 is different from the first electrical resistance between the first layer 10 and the third layer 30 before the first operation OP1. In such a case, when another pulse P1x such as that shown in FIG. 15C is applied, the change of the resistance substantially does not occur. The other pulse P1x has the first pulse height H1 and a pulse width that is 2 times the first pulse width T1. The absolute value of the difference between the third electrical resistance between the first layer 10 and the third layer 30 after such another pulse P1x is applied between the first layer 10 and the third layer 30 and the fourth electrical resistance before the other pulse P1x is applied between the first layer 10 and the third layer 30 is less than the absolute value of the difference between the second electrical resistance and the first electrical resistance. In other words, when the other pulse P1x is applied, the electrical resistance substantially does not change. Or, the change of the electrical resistance when the other pulse P1x is applied is smaller than the change of the electrical resistance when the first pulse P1 is applied.

The change of the electrical resistance recited above can be compared more reliably by using the average value of operations of multiple times. For example, the process of applying the first pulse P1 recited above and detecting the change of the electrical resistance before and after is performed multiple times. The average value of the absolute values of the change of the electrical resistance in such a case is determined. On the other hand, a process of applying the other pulse P1x recited above and detecting the change of the electrical resistance before and after is performed multiple times. The average value of the absolute values of the change of the electrical resistance in such a case is determined. By comparing the two average values recited above, it can be seen more reliably that the change of the electrical resistance when the other pulse P1x is applied is smaller than the change of the electrical resistance when the first pulse P1 is applied.

In the magnetic element 110 according to the embodiment, for example, the change of the electrical resistance when the other pulse P1x recited above is applied is smaller than the change of the electrical resistance when the first pulse P1 recited above is applied.

It is favorable for the first pulse width T1 (the pulse time) of the first pulse P1 (the rewrite pulse) recited above to be not less than 0.5 times and not more than 1.5 times the absolute value of the parameter "$\pi/(\gamma\mu_0 \cdot H_{\mathit{eff}})$." "$\pi$" is 3.14. "$\gamma$" is the gyromagnetic ratio (rad/sT). "$\mu_0$" is the permeability (H/m) of a vacuum. "$H_{\mathit{eff}}$" is the effective magnetic field (A/m) applied to the first layer 10.

The stable control (change) of the orientation of the magnetization is possible by using the first pulse P1 having the first pulse width T1 and the first pulse height H1. It is more favorable for the first pulse width T1 to be not less than 0.8 times and not more than 1.2 times the absolute value of the parameter "$\pi/(\gamma\mu_0 \cdot H_{\mathit{eff}})$." It is favorable for the first pulse width T1 to be not less than 0.9 times and not more than 1.1 times the absolute value of the parameter "$\pi/(\gamma\mu_0 \cdot H_{\mathit{eff}})$." By such a first pulse width T1, for example, a more stable control (change) of the orientation of the magnetization is possible.

In the control of the magnetic anisotropy by the voltage, for example, a voltage is applied to an element having a structure of a ferromagnetic layer/dielectric layer/counter electrode. For example, the interface magnetic anisotropy changes due to the phenomenon of the electron state change due to charge storage at the interface, etc. For example, the perpendicular magnetic anisotropy is reduced by applying a voltage having a polarity such that the electrons accumulate at the interface of the ferromagnetic layer/dielectric layer. By applying the voltage of the reverse polarity, the perpendicular magnetic anisotropy increases. In the perpendicular magnetization film, for example, the "upward orientation" or the "downward orientation" of the magnetization with respect to the film surface is stable. By applying the voltage to such a perpendicular magnetization film, the easy magnetization axis can be aligned with the in-plane direction.

When the applied voltage is removed, the easy magnetization axis becomes stable in the original surface normal direction. The "upward orientation" and the "downward orientation" are energetically equivalent. Therefore, it is difficult to control the magnetization direction to the desired orientation. Therefore, the control of the magnetization reversal by the application of a static voltage is difficult.

For example, by applying a prescribed pulse voltage to the element in a state in which an in-plane bias magnetic field is applied, the effective perpendicular magnetic anisotropy of the ferromagnetic layer can be reduced by the control of the magnetic anisotropy by the voltage. For example, the magnetization processes around the in-plane bias magnetic field. For example, the magnetization reversal can be controlled by setting the pulse width of the pulse voltage to be the length of the timing of the magnetization reversing about 180 degrees.

For example, this method corresponds to a voltage-induced dynamic magnetization reversal. The rise time of the pulse voltage and the rise time of the pulse voltage each are, for example, not more than about 500 ps (picosecond). The pulse width of the pulse voltage is a time based on the parameter "$\pi/(\gamma\mu_0 \cdot H_{\mathit{eff}})$" recited above. For example, the parameter corresponds to the reversal time of the magnetization of the first layer 10 of the stacked body including the first layer 10 and the second layer 20.

"$H_{\mathit{eff}}$" of the parameter "$\pi/(\gamma\mu_0 \cdot H_{\mathit{eff}})$" is, for example, the in-plane bias magnetic field applied from the outside. For example, an antiferromagnetic layer (a fourth layer) may be further provided in the magnetic element 110; and the first layer 10 may be positioned between the fourth layer and the second layer 20. For example, the fourth layer contacts the first layer 10. A magnetic field is applied to the first layer 10 from the fourth layer; and the first layer 10 is provided with unidirectional anisotropy aligned with the plane. "$H_{\mathit{eff}}$" corresponds to the magnetic field applied to the first layer 10 from the fourth layer. Also, an in-plane magnetization film may be further provided in the magnetic element.

For example, the write operation of, for example, a voltage-controlled MRAM is performed using the first pulse P1 recited above.

For example, in the embodiment, for example, the effective perpendicular magnetic anisotropy is reduced by the large voltage magnetic anisotropy change. A high perpendicular magnetic anisotropy configuration is applied when the element is downscaled for higher capacity. In the embodiment, for example, a high interface magnetic anisotropy and a large voltage effect are obtained. Thereby, even in the case where the element is downscaled for higher capacity, a stable operation is obtained.

The magnetic element according to the embodiment is applicable to various voltage-controlled magnetic devices. For example, the embodiment is applicable to a device in which a spin wave or a pure spin current is used for information transmission. According to the embodiment, for example, a highly efficient spin wave or a highly efficient pure spin current can be generated by a voltage. The embodiment is effective for the power consumption reduction of these devices. For example, the embodiment also is applicable to the voltage control of a magneto-optic element such as a magneto-optic spatial light modulator, etc.

For example, there is a memory device that uses a magnetic tunnel junction (MTJ: Magnetic Tunnel junction) element including a ferromagnetic layer (memory layer)/dielectric layer/ferromagnetic layer (reference layer). For example, there is a method in which a current is caused to flow in the MTJ element; and the magnetization of the memory layer is reversed using the spin-transfer torque effect. In such an example, it is considered that the decrease of the drive power is limited because the current is used.

On the other hand, magnetization reversal by voltage control has been proposed. For example, when a voltage is applied to a stacked film including a MgO film and a ferromagnetic film of Fe or the like having a thickness of about 1 atomic layer, the easy orientation direction of the magnetization (the magnetic anisotropy) of the ferromagnetic film changes. For example, it is considered that the magnetic anisotropy changes due to the spin-orbit coupling due to the electron state of the ferromagnetic film being modulated at the interface between the ferromagnetic film and the MgO film by the effects of the interface charge storage at the interface, etc.

The magnetization reversal can be controlled by utilizing the control of the magnetic anisotropy by the voltage. It is considered that the drive power in such a case is $\frac{1}{10}$ to $\frac{1}{100}$ of the drive power in the case of current control.

For example, a high perpendicular magnetic anisotropy of the magnetic element is desirable. It is desirable for the change efficiency of the voltage magnetic anisotropy of the magnetic element to be high. Due to the high perpendicular magnetic anisotropy, for example, the orientation of the magnetization is stable with respect to heat fluctuation. For the stability of the orientation of the magnetization, for example, the parameter of the "(volume of the recording layer×magnetic anisotropy of the memory layer)/thermal energy" is used. By obtaining a high magnetic anisotropy, good thermal stability is obtained even when the memory portion (the memory cell) is downscaled. The storage density of the memory device can be increased thereby.

For example, it is considered that the control of the magnetic anisotropy by the voltage is an interface effect. For example, it is considered that a high interface magnetic anisotropy is obtained by employing a special structure at the interface of the ferromagnetic layer/dielectric layer. For example, it is considered that this is because a special asymmetry or the like occurs in the special structure; and the asymmetry, etc., affects the voltage magnetic anisotropy control.

For example, for the magnetization reversal utilizing the change of the magnetic anisotropy due to the voltage, the perpendicular magnetic anisotropy decreases due to the voltage. For example, even when the downscaling of the element advances and the perpendicular magnetic anisotropy of the memory layer is increased, the magnetic anisotropy can be controlled well by the voltage due to the large voltage effect.

For example, when a high perpendicular magnetic anisotropy is obtained by the interface magnetic anisotropy, the scalability of the voltage-controlled MRAM can be maintained. When the efficiency of the voltage effect is high, the scalability of the voltage-controlled MRAM can be maintained.

In the embodiment, a high perpendicular magnetic anisotropy is obtained by the stacked structure including the first layer 10 and the second layer 20 recited above. In the embodiment, a high efficiency of the voltage effect is obtained.

Third Embodiment

The embodiment relates to a magnetic sensor.

Figure 16A:
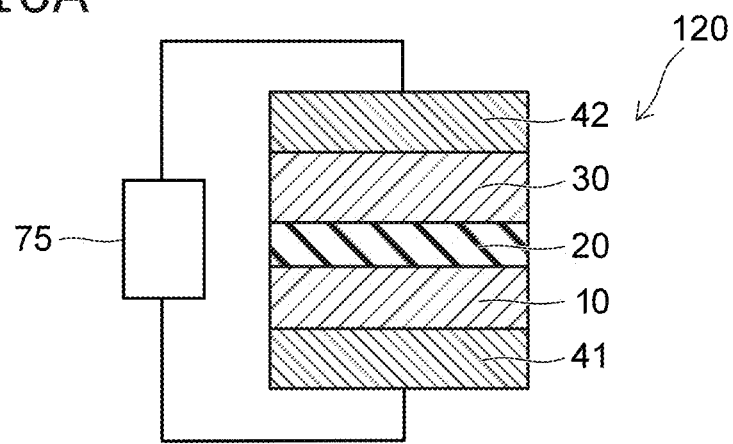
FIG. 16A and FIG. 16B are schematic views illustrating the magnetic sensor according to the third embodiment.
Figure 16B:
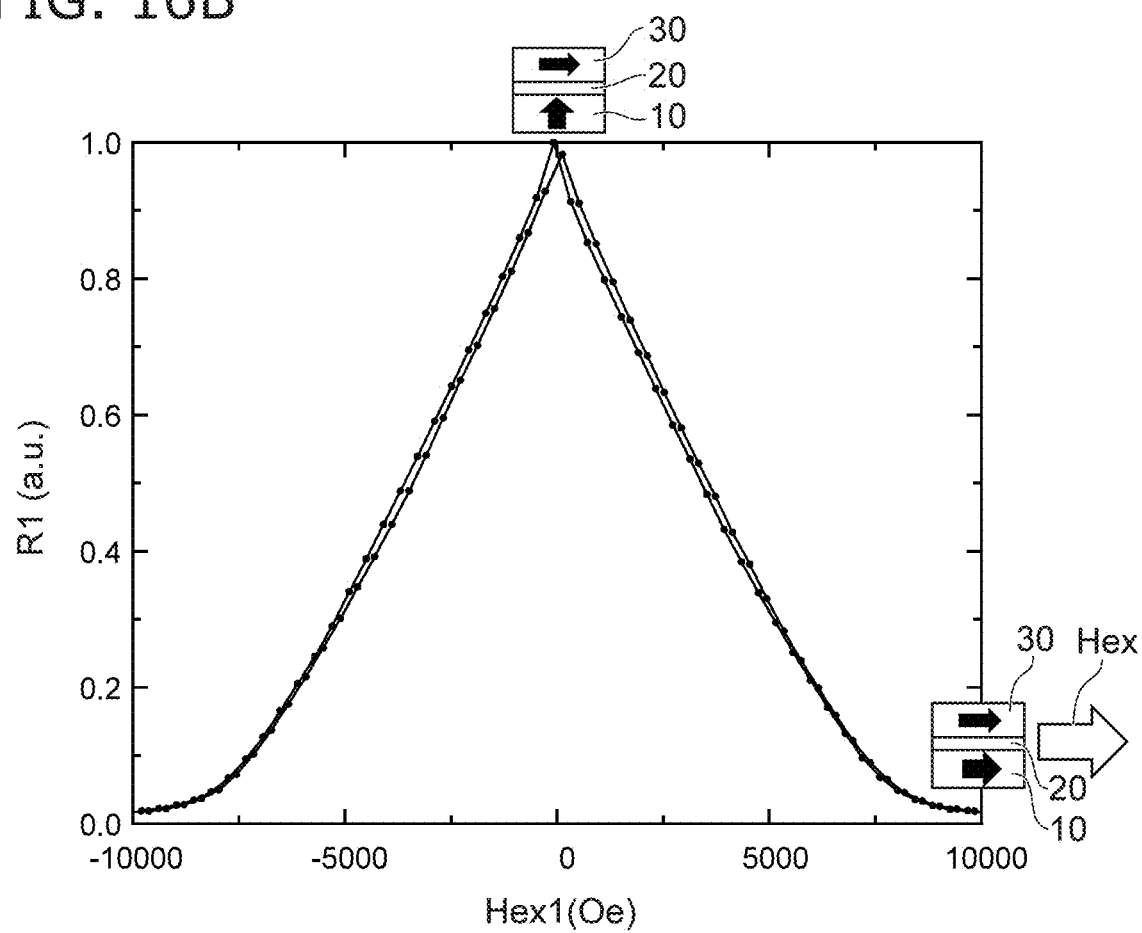

FIG. 16A and FIG. 16B are schematic views illustrating the magnetic sensor according to the third embodiment.

FIG. 16A is a schematic cross-sectional view illustrating the magnetic sensor 120. FIG. 16B is a graph illustrating a characteristic of the magnetic sensor 120.

As shown in FIG. 16A, the magnetic sensor 120 according to the embodiment includes the first layer 10, the second layer 20, and the third layer 30. The first conductive layer 41 and the second conductive layer 42 are further provided in the example. The configurations described in the first embodiment are applicable to the first layer 10, the second layer 20, the third layer 30, the first conductive layer 41, and the second conductive layer 42.

In the magnetic sensor 120, the magnetic field that is received by the magnetic sensor 120 can be detected. For example, the electrical resistance of the magnetic sensor 120 changes according to the magnetic field received by the magnetic sensor 120. A detector 75 is provided in the example. The detector 75 is electrically connected to the first conductive layer 41 and the second conductive layer 42. The detector 75 can output a value (at least one of a voltage, a current, or a resistance) corresponding to the electrical resistance of the magnetic sensor 120.

FIG. 16B illustrates a characteristic of the magnetic sensor 120. The horizontal axis of FIG. 16B is an intensity Hex1 (oersted: Oe) of an external magnetic field Hex. The vertical axis is an electrical resistance R1 (arbitrary units) of the magnetic sensor 120. The electrical resistance of the magnetic sensor 120 substantially corresponds to the electrical resistance between the first conductive layer 41 and the second conductive layer 42. The electrical resistance of the magnetic sensor 120 substantially corresponds to the electrical resistance between the first layer 10 and the third layer 30. In the example, the external magnetic field Hex is perpendicular to the stacking direction of the first layer 10 and the second layer 20.

In the example, the first conductive layer 41 is a Cr film (having a thickness of 30 nm). The first layer 10 includes Fe and Ir. The first layer 10 is formed by the method described with reference to FIG. 2A and FIG. 2B. The Ir film 10$q$ that has a thickness of 0.05 nm is formed on the Fe film 10$p$ having a thickness of 0.84 nm. Subsequently, the second layer 20, the third layer 30, and the second conductive layer 42 are formed; and heat treatment is performed for 20 minutes at 350° C. The FeIr film that is obtained thereby is used to form the first layer 10. The second layer 20 is a MgO film (having a thickness of 2.3 nm). The third layer 30 is an Fe film (having a thickness of 10 nm). The second conductive layer 42 is a stacked film including a Ta film (having a thickness of 5 nm) and a Ru film (having a thickness of 7 nm). The Ta film is positioned between the Ru film and the MgO film.

As shown in FIG. 16B, the electrical resistance R1 is high when the intensity Hex1 of the external magnetic field Hex is 0. This state corresponds to a state in which the magnetization of the third layer 30 crosses the stacking direction and the magnetization of the first layer 10 is perpendicular to the stacking direction. The electrical resistance R1 is low when the absolute value of the intensity Hex1 of the external magnetic field Hex is large. This state corresponds to a state in which the magnetization of the first layer 10 is aligned with the external magnetic field Hex. The electrical resistance R1 changes substantially linearly with respect to the external magnetic field Hex. The magnetic element according to the embodiment is applicable as a magnetic sensor. A magnetic sensor that has high operational stability can be provided.

According to the magnetic element and the magnetic memory device according to the embodiments, for example, the perpendicular magnetic anisotropy can be increased at the interface of the magnetic layer/intermediate layer (MgO layer) of a spintronics device. According to the embodiments, a high thermal stability is obtained. For example, the scalability can be maintained. According to the embodiments, for example, a large voltage effect is obtained. According to the embodiments, for example, a high performance voltage-controlled MRAM can be provided. According to the embodiments, for example, a low power consumption memory device can be provided.

The magnetic element according to the embodiment is applicable to a magnetic memory device other than voltage-controlled MRAM. For example, the magnetic element according to the embodiment is applicable to spin torque MRAM.

According to the embodiments, a magnetic element, a magnetic memory device, and a magnetic sensor can be provided in which the operational stability can be improved.

In this specification, the state of being electrically connected includes the state in which two conductors are in direct contact. The state of being electrically connected includes the state in which two conductors are connected by another conductor (e.g., an interconnect or the like). The state of being electrically connected includes the state in which a switching element (a transistor or the like) is provided between a path between two conductors so that a state is formable in which a current flows in the path between the two conductors.

The embodiments may include the following configurations.

Configuration 1

A magnetic element, comprising:
a first layer including a first element and a second element, the first element including at least one selected from the group consisting of Fe, Co, and Ni, the second element including at least one selected from the group consisting of Ir and Os; and
a second layer, the second layer being nonmagnetic.

Configuration 2

The magnetic element according to Configuration 1, wherein a concentration of the second element in the first layer is not less than 3 atomic percent and not more than 25 atomic percent.

Configuration 3

The magnetic element according to Configuration 1 or 2, wherein a thickness of the first layer is not less than 0.26 nanometers and not more than 5 nanometers.

Configuration 4

The magnetic element according to any one of Configurations 1 to 3, wherein
the first layer includes:
a first region; and
a second region positioned between the first region and the second layer, and
a concentration of the second element in the second region is lower than a concentration of the second element in the first region, or the second region does not include the second element.

Configuration 5

The magnetic element according to any one of Configurations 1 to 4, wherein the first layer has a body-centered cubic (bcc) structure.

Configuration 6

The magnetic element according to any one of Configurations 1 to 5, wherein the first layer includes a single crystal oriented in a (001) plane, or a polycrystal preferentially oriented in the (001) plane.

Configuration 7

The magnetic element according to any one of Configurations 1 to 6, wherein the second layer includes at least one of an oxide of a third element, a nitride of the third element, or a fluoride of the third element, the third element including at least one selected from the group consisting of Mg, Si, Al, Ti, Zr, Hf, Ta, Zn, Sr, and Ba.

Configuration 8

The magnetic element according to any one of Configurations 1 to 7, wherein the second layer includes MgO.

Configuration 9

The magnetic element according to any one of Configurations 1 to 8, wherein
the second layer includes MgO, and
the MgO includes a single crystal or a polycrystal, the single crystal or the polycrystal being preferentially oriented in a (001) plane.

Configuration 10

The magnetic element according to any one of Configurations 1 to 9, wherein a resistance·area of the second layer is 10 $\Omega\mu m^2$ or more.

Configuration 11

The magnetic element according to any one of Configurations 1 to 10, wherein the magnetic element further includes a third layer, the third layer being ferromagnetic, and
the second layer is positioned between the first layer and the third layer.

Configuration 12

The magnetic element according to Configuration 11, wherein the third layer includes at least one selected from the group consisting of Fe, Co, Ni, and Mn.

Configuration 13

A magnetic memory device, comprising:
the magnetic element according to any one of Configurations 1 to 12; and
a controller.

Configuration 14

A magnetic sensor, comprising the magnetic element according to Configuration 11 or 12.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic elements, magnetic memory devices, and magnetic sensors such as first to third layers, conductive layers, controllers, interconnects, switches, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic elements, magnetic memory devices, and magnetic sensors practicable by an appropriate design modification by one skilled in the art based on the magnetic elements, the magnetic memory devices, and the magnetic sensors described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

REFERENCE NUMERAL LIST

10 first layer
10a first region
10b second region
10p Fe film
10q Ir film
11 Fe layer
12 FeIr layer
13 FeOs layer
20 second layer
20R intermediate region
20a, 20b Mg layers
21, 22 first and second partial regions
25 nonmagnetic layer
30 third layer
41 first conductive layer
42 second conductive layer 51 substrate
70 controller
70a first interconnect
70b second interconnect
70s switch
75 detector
110, 111, 112a, 112b, and 113a to 113f magnetic elements
110a, 110b, 110c, 110d, 110e, 119 samples
120 magnetic sensor
210 magnetic memory device
E1 first element
E2 second element
EF electric field intensity
H1, H2 first and second pulse heights
Hex external magnetic field
Hex1 intensity
KRA Kerr rotation angle
$K_{eff}$t parameter
$K_{i,0}$ interface magnetic anisotropy
MF intensity
OP1 to OP3 first to third operations
P1, P2 first and second pulses
P1x other pulse
R1 electrical resistance
S1 signal
ST01 to ST05, ST14, ST15 structures
T1 first pulse width
ti time
tm, tp, tq thicknesses

The invention claimed is:

1. A magnetic element, comprising:
a first layer including a first element and a second element, the first element including at least one selected from the group consisting of Fe, Co, and Ni, the second element including at least one selected from the group consisting of Ir and Os; and
a second layer, the second layer being nonmagnetic,
wherein a concentration of the second element in the first layer is not less than 3 atomic percent and not more than 25 atomic percent.

2. The magnetic element according to claim 1, wherein a thickness of the first layer is not less than 0.26 nanometers and not more than 5 nanometers.

3. The magnetic element according to claim 1, wherein the first layer includes:
a first region; and
a second region positioned between the first region and the second layer, and
a concentration of the second element in the second region is lower than a concentration of the second element in the first region, or the second region does not include the second element.

4. The magnetic element according to claim 1, wherein the first layer has a body-centered cubic (bcc) structure.

5. The magnetic element according to claim 1, wherein the first layer includes a single crystal oriented in a (001) plane, or a polycrystal preferentially oriented in the (001) plane.

6. The magnetic element according to claim 1, wherein the second layer includes at least one of an oxide of a third element, a nitride of the third element, or a fluoride of the third element, the third element including at least one selected from the group consisting of Mg, Si, Al, Ti, Zr, Hf, Ta, Zn, Sr, and Ba.

7. The magnetic element according to claim 1, wherein the second layer includes MgO.

8. The magnetic element according to claim 1, wherein the second layer includes MgO, and
the MgO includes a single crystal or a polycrystal, the single crystal or the polycrystal being preferentially oriented in a (001) plane.

9. The magnetic element according to claim 1, wherein a resistance-area of the second layer is 10 Ωμm 2 or more.

10. The magnetic element according to claim 1, wherein the magnetic element further includes a third layer, the third layer being ferromagnetic, and
the second layer is positioned between the first layer and the third layer.

11. The magnetic element according to claim 10, wherein the third layer includes at least one selected from the group consisting of Fe, Co, Ni, and Mn.

12. A magnetic memory device, comprising:
the magnetic element according to claim 1; and
a controller.

13. A magnetic sensor, comprising the magnetic element according to claim 10.

* * * * *